United States Patent
Lo et al.

(10) Patent No.: US 10,672,775 B2
(45) Date of Patent: Jun. 2, 2020

(54) SEMICONDUCTOR DEVICE HAVING STRAP CELL

(71) Applicant: TAIWAN SEMICONDUCTOR MANUFACTURING CO., LTD., Hsinchu (TW)

(72) Inventors: Kuo-Hung Lo, Hsinchu (TW);
Feng-Ming Chang, Zhubei (TW);
Ying-Hsiu Kuo, Hsinchu (TW);
Ping-Wei Wang, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/234,386

(22) Filed: Dec. 27, 2018

(65) Prior Publication Data
US 2019/0363094 A1 Nov. 28, 2019

Related U.S. Application Data

(60) Provisional application No. 62/676,600, filed on May 25, 2018.

(51) Int. Cl.
*H01L 27/11* (2006.01)
*H01L 23/52* (2006.01)
(Continued)

(52) U.S. Cl.
CPC ........ *H01L 27/1104* (2013.01); *G11C 11/412* (2013.01); *H01L 23/528* (2013.01);
(Continued)

(58) Field of Classification Search
CPC ............... H01L 27/1104; H01L 23/528; H01L 27/0924; H01L 27/0928; H01L 29/1083; G11C 11/412
(Continued)

(56) References Cited

U.S. PATENT DOCUMENTS

| 9,871,048 B1* | 1/2018 | Huang ................. H01L 27/1104 |
| 2005/0018474 A1* | 1/2005 | Sohn ...................... G11C 11/419 365/154 |

(Continued)

FOREIGN PATENT DOCUMENTS

TW 201742252 A 12/2017

*Primary Examiner* — Sheikh Maruf
(74) *Attorney, Agent, or Firm* — McDermott Will & Emery LLP

(57) ABSTRACT

A semiconductor device includes: a first well having a first conductivity-type extending along a first direction; second and third wells having a second conductivity-type and disposed on opposite sides of the first well in a second direction; a first array of bitcells and a second array of bitcells disposed on the first to third wells; a strap cell disposed on the first to third wells and between the first and second arrays and including first and second well pickup regions having the first conductivity-type, disposed on the first well, and spaced-apart from each other in the first direction, and third and fourth well pickup regions having the second conductivity-type and disposed on the second and third wells, respectively; first and second conductive patterns electrically connected to the first and second well pickup regions, respectively; and a third conductive pattern electrically connected to the third and fourth well pickup regions.

20 Claims, 25 Drawing Sheets

(51) Int. Cl.
*H01L 29/10* (2006.01)
*H01L 27/092* (2006.01)
*G11C 11/412* (2006.01)
*H01L 23/528* (2006.01)

(52) U.S. Cl.
CPC ...... *H01L 27/0924* (2013.01); *H01L 27/0928* (2013.01); *H01L 29/1083* (2013.01)

(58) Field of Classification Search
USPC ........... 257/371, 369, 314, 263, 294, E27.98
See application file for complete search history.

(56) References Cited

U.S. PATENT DOCUMENTS

| | | | |
|---|---|---|---|
| 2009/0003027 A1* | 1/2009 | Inage | G11C 5/025 365/51 |
| 2009/0285039 A1* | 11/2009 | Adams | G11C 11/413 365/189.11 |
| 2010/0193877 A1* | 8/2010 | Liaw | G11C 11/412 257/390 |
| 2013/0026580 A1* | 1/2013 | Morimoto | H01L 27/0207 257/369 |
| 2013/0320458 A1* | 12/2013 | Deng | H01L 27/1104 257/390 |
| 2014/0042507 A1* | 2/2014 | Iwata | H01L 27/14612 257/294 |
| 2014/0264477 A1* | 9/2014 | Bhalla | H01L 29/0619 257/263 |
| 2015/0008529 A1* | 1/2015 | Wen | H01L 27/0277 257/369 |
| 2015/0145015 A1* | 5/2015 | Shin | H01L 27/11556 257/314 |
| 2015/0170734 A1* | 6/2015 | Hwang | G11C 11/412 365/72 |
| 2017/0047343 A1* | 2/2017 | Lee | H01L 27/1157 |

* cited by examiner

R21

R21'

SEMICONDUCTOR DEVICE HAVING STRAP CELL

CROSS REFERENCE TO RELATED APPLICATION

This application claims priority to U.S. Provisional Application No. 62/676,600 filed May 25, 2018, entitled "STRAP FOR SRAM ARRAYS," the entire disclosure of which is incorporated herein by reference.

BACKGROUND

In semiconductor device such as a static random access memory (SRAM), bitcells or arrays of bit cells extend in a column direction, strap cells are provided between the bitcells or arrays of bitcells and include well pickup regions formed inside wells. The strap cells are used for voltage pick-up and to provide well bias that prevents voltage drop along the column direction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
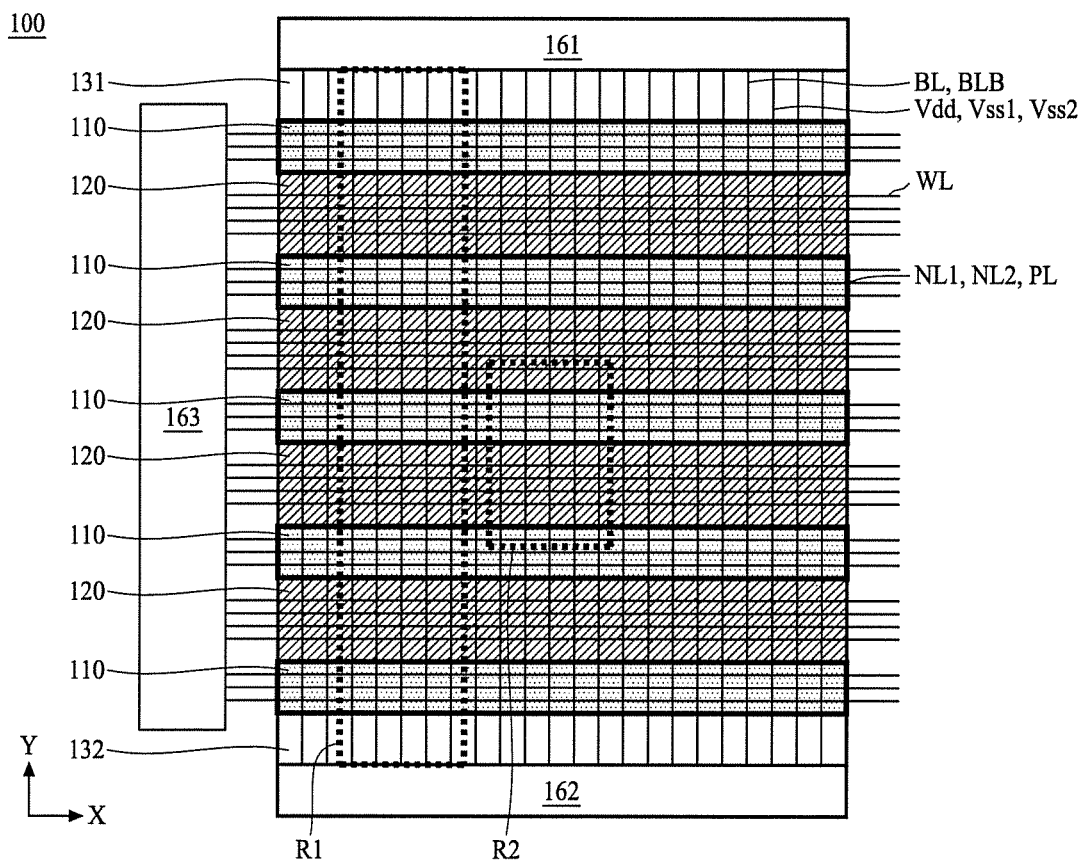
FIG. 1 shows a schematic layout of a semiconductor device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Although operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently.

In some embodiments of the present disclosure, semiconductor fins are employed for e.g., fin field-effect transistors (FinFET). Semiconductor fins may protrude from a semiconductor substrate and be used to form various semiconductor devices including, but not limited to, the fin field-effect transistors (FinFET). The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 shows a schematic layout of a semiconductor device 100 according to embodiments of the present disclosure. In some embodiments the semiconductor device 100 is a static random access memory (SRAM).

Referring to FIG. 1, the semiconductor device 100 according to embodiments of the present disclosure includes strap regions 110, bitcell regions 120 each including bitcells or arrays of bitcells extending in a column direction (i.e., Y direction) and spaced-apart from each other by the strap regions 110, and peripheral circuits including a first Y-multiplexer and sensing amplifier 161, a second Y-multiplexer and sensing amplifier 162, and a wordline driver/selector 163.

The bitcell regions 120 and the strap regions 110 are alternatively disposed in the column direction between the first Y-multiplexer and sensing amplifier 161 and the second Y-multiplexer and sensing amplifier 162.

Bitlines BL and complementary bitlines BLB that carry signals complemental to those carried by the bitlines BL extend along the column direction and are electrically connected to the bitcells and the first Y-multiplexer and sensing amplifier 161 and/or the second Y-multiplexer and sensing amplifier 162.

Wordlines WL extend over the bitcells in the bitcell regions 120 along a row direction (i.e., X direction) perpendicular to the column direction and are electrically connected to the bitcells and the wordline driver/selector 163. Although one wordline driver/selector 163 is illustrated in FIG. 1, the semiconductor device 100 can include another wordline driver/selector disposed on another side of the bitcell regions 120 and the strap regions 110 opposite to the wordline driver/selector 163.

The first Y-multiplexer and sensing amplifier 161, the second Y-multiplexer and sensing amplifier 162, and the wordline driver/selector 163 are operative to select bitcells such that data stored in the bitcells can be read and output by the first Y-multiplexer and sensing amplifier 161 and/or the second Y-multiplexer and sensing amplifier 162, and new data can be written to the bitcells.

In some embodiments, power supply patterns Vdd and Vss1/Vss2, made of conductive patterns of one layer, for example, a first metal layer, extend along the column direction, and are connected to source regions of corresponding transistors of the bitcells in the column direction. When terminal voltages provided by, for example, a power supply source, are applied to the power supply patterns Vdd and Vss1/Vss2, respectively, the bitcells connected to the power supply patterns Vdd and Vss1/Vss2 are energized to allow the bitcells to operate, such that the data stored thereof can be read therefrom or new data can be written thereto by operation of the first Y-multiplexer and sensing amplifier 161, the second Y-multiplexer and sensing amplifier 162, and the wordline driver/selector 163.

The strap regions 110 including strap cells provide well pickup in active regions inside wells including N-type wells and P-type wells. The strap cells are used for voltage pick-up to provide well bias that may prevent or suppress voltage drop along the extension direction (i.e., the column direction) of the bitline BL and the complementary bitline BLB. The strap cells in the strap regions 110 do not store data but instead provide connections between the N-type wells and the P-type wells and the terminal voltages.

In some embodiments, the semiconductor device 100 includes uppermost and lowermost strap regions 110 above and below the uppermost and lowermost bitcell regions 120, respectively, in the view shown in FIG. 1. The strap regions 110 distributed among the bitcell regions 120 allow the pairs of the bit line BL and complementary bitline BLB to propagate longer over greater numbers of bitcells or bitcell arrays in the column direction, without causing a difference in the pairs of the bit line BL and complementary bitline BLB between the bitcells in the column direction to be greater than a predetermined tolerance.

However, if strap cells are not provided or are provided with an insufficient density in the column direction, bitcells that are spaced different distances from the closest strap cells may exhibit different behavior. For example, latch-up may occur, causing malfunction or performance degradation of the semiconductor device.

Still referring to FIG. 1, the semiconductor device 100 further includes N-well strap patterns NL1/NL2 and P-well strap patterns PL each extending in the row direction over each strap region 110. The N-well well strap patterns NL1/NL2 and the P-well strap patterns PL are made of conductive patterns of one layer, for example, a second metal layer, and are connected to the terminal voltages, respectively. In some embodiments, the first metal layer and the second metal layer are disposed on different levels and patterns thereof are connected to each other by vias penetrating an insulating layer disposed between the first metal layer and the second metal layer. In some embodiments, the N-well strap patterns NL1/NL2 are electrically connected to the power supply pattern Vdd, and the P-well strap patterns PL are electrically connected to the power supply patterns Vss1/Vss2, through vertical connection structures, such as vias and contacts, in the strap regions 120. These features will be described later with reference to FIGS. 3 and 5A-9D.

In some embodiments, the wordlines WL are made of the same conductive layer used to make the N-well strap patterns NL1/NL2 and the P-well strap patterns PL, although the present disclosure is not limited thereto.

In some embodiments, the semiconductor device 100 further includes an upper edge cell region 131 and a lower edge cell region 132 in which edge dummy cells are formed. In some embodiments, the upper edge cell region 131 is disposed between the first Y-multiplexer and sensing amplifier 161 and the uppermost strap region 110 in the column direction in the view shown in FIG. 1, and the lower edge cell region 132 is disposed between the second Y-multiplexer and sensing amplifier 162 and the lowermost strap region 110 in the column direction in the view shown in FIG. 1.

In other embodiments, the uppermost strap region 110 and the lowermost strap region 110 shown in FIG. 1 can be omitted. In this case, the upper cell edge cell region 131 is disposed directly between the uppermost bitcell region 120 and the first Y-multiplexer and sensing amplifier 161, and the lower cell edge cell region 132 is disposed directly between the lowermost bitcell region 120 and the second Y-multiplexer and sensing amplifier 162.

Optionally or alternatively, the semiconductor device 100 includes further additional edge cell regions (not shown), in which additional edge dummy cells are formed, on the left and right sides of a combined region including the strap regions 110 and the bitcell regions 120. As such, the edge cell regions 131 and 132 and the additional edge cell regions completely surround all of the bitcell regions. In this case, variations of the bitcells in different locations caused by process variations in different locations can be suppressed.

Figure 2:
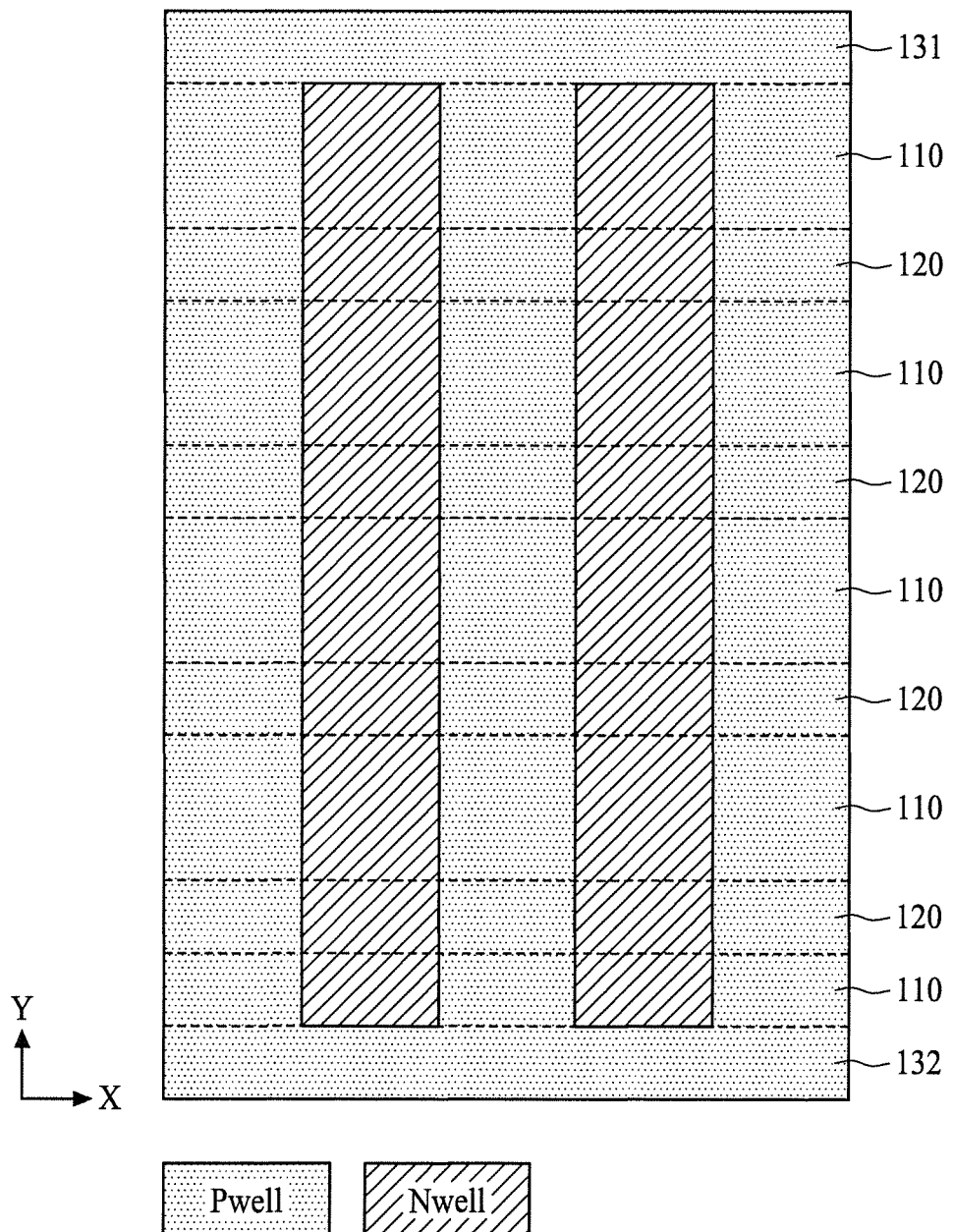
FIG. 2 shows an enlarged view of region R1 in FIG. 1, according to embodiments of the present disclosure.

FIG. 2 shows an enlarged view of region R1 in FIG. 1. For convenience of illustration, selective layers in region R1 are illustrated in FIG. 2, although the semiconductor device 100 according to embodiments of the present disclosure contains additional layers.

Referring to FIGS. 1 and 2, the upper edge cell region 131 includes a P-type well Pwell. The strap cell regions 110 and the bitcell regions 120 include P-type wells Pwell and N-type wells Nwell alternately arranged along the row direction. The lower edge cell region 132 includes a P-type well Pwell. The P-type wells Pwell in the strap cell regions 110 and the bitcell regions 120, and the P-type wells Pwell in the upper and lower edge cell regions 131 and 132 form one continuous integral region as shown in FIG. 2, in which the N-type wells Nwell of the strap cell regions 110 and the bitcell regions 120 having stripe structures are disposed in the row direction.

Although not shown, according to other embodiments, the upper edge cell region 131 includes an N-type well, the strap cell regions 110 and the bitcell regions 120 include P-type wells and N-type wells alternately arranged along the row direction, and the lower edge cell region 132 includes an N-type well. The N-type wells in the strap cell regions 110 and the bitcell regions 120, and the N-type wells in the upper and lower edge cell regions 131 and 132 form one continuous integral region, in which the P-type wells of the strap cell regions 110 and the bitcell regions 120 having stripe structures are disposed in the row direction.

Figure 3:
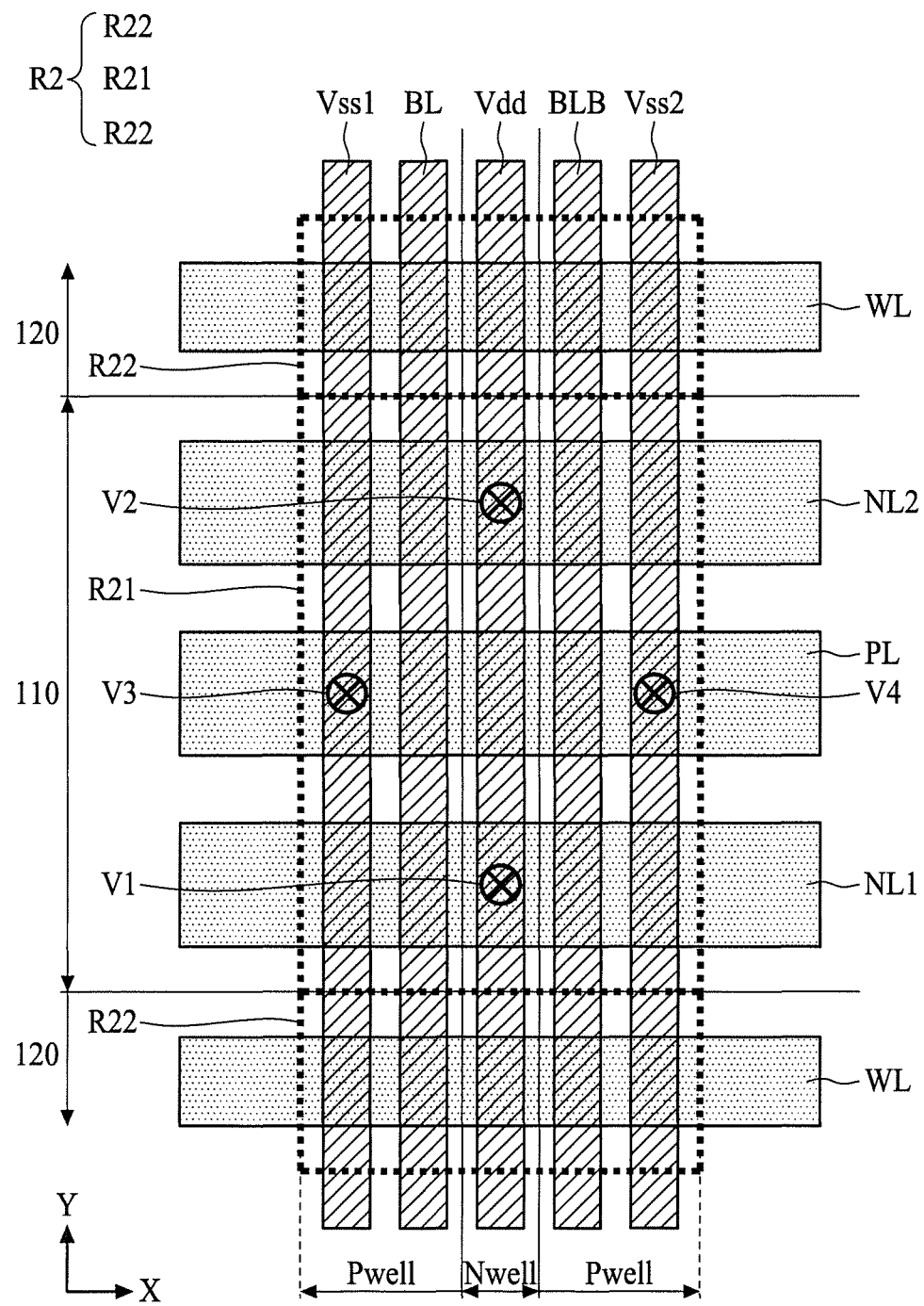
FIG. 3 shows an enlarged view of region R2 in FIG. 1, according to embodiments of the present disclosure.

FIG. 3 shows an enlarged view of region R2 in FIG. 1. For convenience of illustration, selective layers in the region R2 are illustrated in FIG. 3, although the semiconductor device 100 according to embodiments of the present disclosure contains additional layers not shown in FIG. 3.

Referring to FIG. 3, in one column, a strap cell R21 is disposed between two bitcells R22 in two bitcell regions 120 spaced apart from the strap region 110. A strap cell refers to one unit cell in the strap region 110 having the same width in the row direction as the bitcell and aligned to the bitcell in the column direction.

Each bitcell R22 includes one or more wordlines WL extending over the bitcell R22 along the row direction X. The wordline WL extending across the bitcells R22 in the same row is electrically connected to corresponding transistors of the bitcells in the same row. Although not shown in FIG. 3, the wordlines WL are electrically connected to peripheral circuits such as the wordline driver/selector 163.

Each bitcell R22 includes bitline BL, complementary bitline BLB, power supply patterns Vdd and Vss1/Vss2 made of the same conducive layer, such as the first metal layer. In FIG. 3, the power supply pattern Vss1, the bitline BL, the power supply pattern Vdd, the complementary bitline BLB, and the power supply pattern Vss2 are arranged in this order along the row direction X. However, the order of the power supply pattern Vss1, the bitline BL, the power supply pattern Vdd, the complementary bitline BLB, and the power supply pattern Vss2 is not limited to that shown in FIG. 3, and can be modified according to design particulars.

Each of the power supply pattern Vss1, the bitline BL, the power supply pattern Vdd, the complementary bitline BLB, and the power supply pattern Vss2 in the same column extends continuously across the strap regions 110 and the bitcell regions 120. As such, each of the power supply pattern Vss1, the bitline BL, the power supply pattern Vdd, the complementary bitline BLB, and the power supply pattern Vss2 in the same column is electrically connected to corresponding transistors of each bitcells in the same column. Although not shown in FIG. 3, the power supply pattern Vss1, the bitline BL, the power supply pattern Vdd, the complementary bitline BLB, and the power supply pattern Vss2 are electrically connected to peripheral circuits such as the first Y-multiplexer and sensing amplifier 161 and/or the second Y-multiplexer and sensing amplifier 162, and a power supply source that provides the terminal voltages.

In some embodiments, the strap cell R21 includes first and second N-well strap patterns NL1 and NL2 and a P-well strap pattern PL made of the same conductive layer, such as the second metal layer, different from the conductive layer used to form the power supply pattern Vss1, the bitline BL, the power supply pattern Vdd, the complementary bitline BLB, and the power supply pattern Vss2. The conductive layer used to make the first and second N-well strap patterns NL1 and NL2 and the P-well strap pattern PL may also be used to for the wordlines WL, in some embodiments.

Referring to FIG. 3, the P-well strap pattern PL is disposed between first and second N-well strap patterns NL1 and NL2 and extends along the row direction. In some embodiments, the wordlines WL, the first and second N-well strap patterns NL1 and NL2, and the P-well strap pattern PL have a same pitch in the column direction, although the present disclosure is not limited thereto.

In some embodiments, the first N-well strap pattern NL1, the P-well strap pattern PL, and the second N-well strap pattern NL2 are arranged in this order in the column direction, and are disposed between the wordlines WL of the two bitcells R22 on the opposite sides of the strap region 110.

Still referring to FIG. 3, the first and second N-well strap patterns NL1 and NL2 are electrically connected to the power supply pattern Vdd through vias V1 and V2, respectively, and the P-well strap pattern PL is electrically connected to the power supply patterns Vss1 and Vss2 through vias V3 and V4, respectively. Although not shown, the first and second N-well strap patterns NL1 and NL2 and the P-well strap pattern PL are electrically connected to the peripheral circuits such as the power supply source that provides the terminal voltages.

The bitcell R22 will be described in more detail below with reference to FIGS. 4B-4D, and the strap cell R21 will be described in more detail later with reference to FIGS. 5A-6B.

Figure 4A:
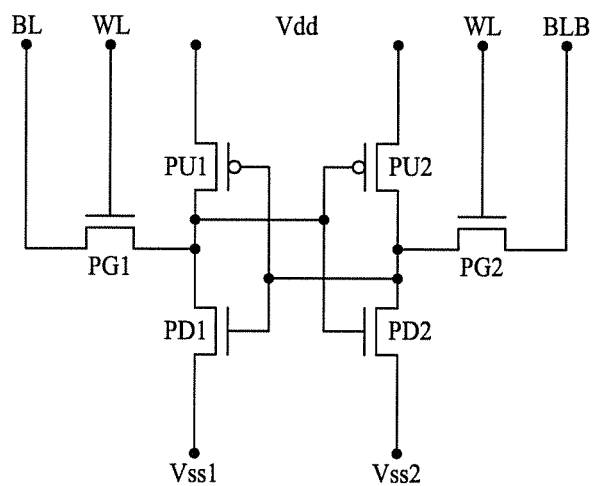
FIG. 4A illustrates a circuit diagram of a static random access memory (SRAM) cell which is implemented as a bitcell according to embodiments of the present disclosure.

FIG. 4A illustrates a circuit diagram of a static random access memory (SRAM) cell which is implemented as the bitcell R22 according to embodiments of the present disclosure. FIG. 4B illustrates a layout of the bitcell R22, of which the circuit diagram is shown in FIG. 4A. FIG. 4C illustrates a simplified layout of the bitcell R22 shown in FIG. 4B, in which some layer are omitted for convenience of illustration. FIG. 4D illustrates a view of bitcells R22 and strap cells R21.

Referring to the drawings, the bitcell R22 is a 6-transistor (6 T) SRAM cell and includes a first inverter including a first pull-up transistor PU1 and a first pull-down transistor PD1 cross-coupled with a second inverter including a second pull-up transistor PU2 and a second pull-down transistor PD2, and first and second pass-gate transistors PG1 and PG2.

Source electrodes of the pass-gate transistors PG1 and PG2 are respectively coupled to a bitline BL and a complementary bitline BLB, and gate electrode layers of the pass-gate transistors PG1 and PG2 are coupled to a word line WL. Drain electrodes of the first pull-up transistor PU1, the first pass-gate transistor PG1, and the first pull-down transistor PD1 are connected to each other. Drain electrodes of the second pull-up transistor PU2, the second pass-gate transistor PG2, and the second pull-down transistor PD2 are connected to each other. Source electrodes of the first and second pull-down transistors PD1 and PD2 are connected to power supply Vss1 and Vss2, respectively. Source electrodes of the first and second pull-up transistors PU1 and PU2 are connected to a power supply Vdd.

Figure 4B:
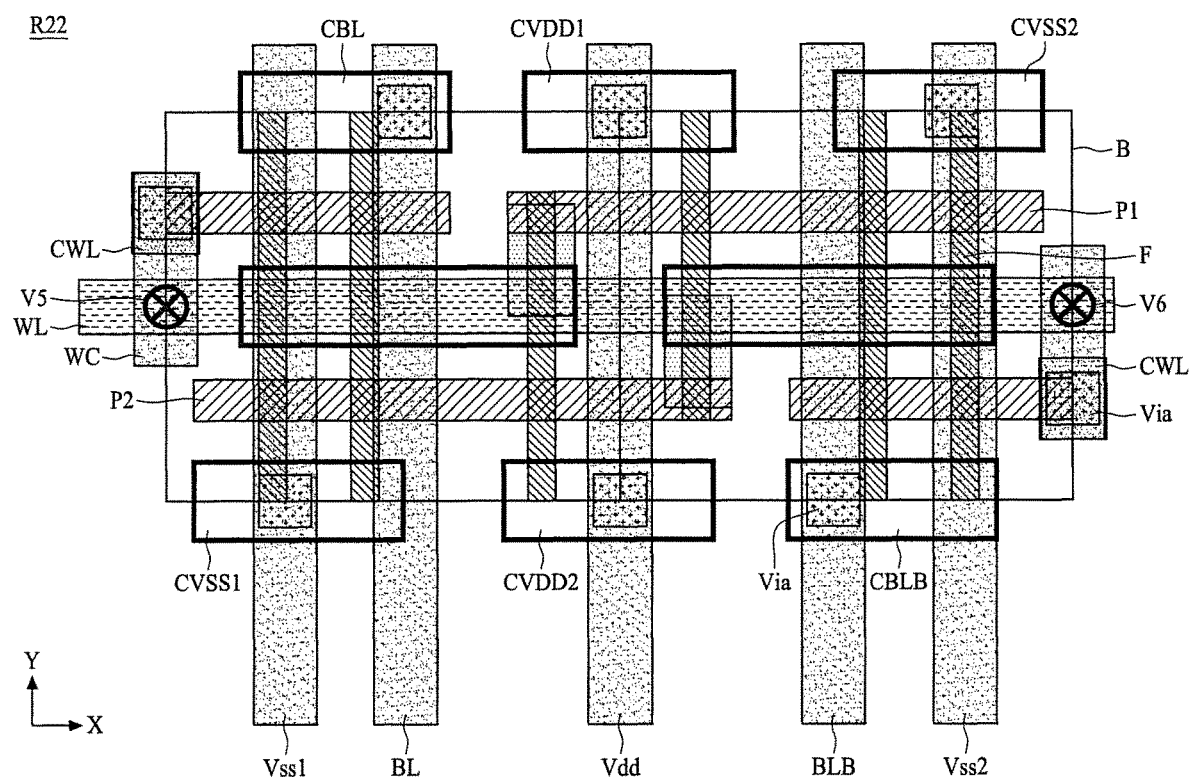
FIG. 4B illustrates a layout of a bitcell, of which the circuit diagram is shown in FIG. 4A, according to embodiments of the present disclosure.
Figure 4C:
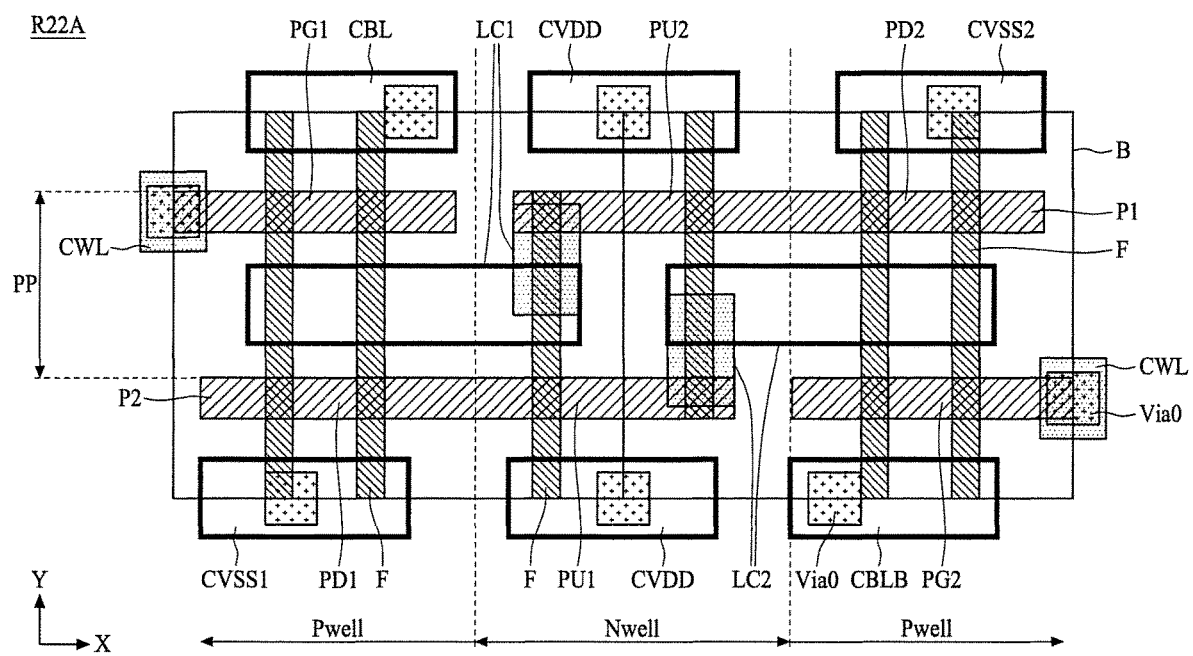
FIG. 4C illustrates a simplified layout of a bitcell shown in FIG. 4B, according to embodiments of the present disclosure.

As shown in FIGS. 4B and 4C, the bitcell R22 is formed in a region defined by a boundary B and includes three wells which are an N-type well Nwell located at a center thereof and first and second P-type wells Pwell located on opposite sides of the N-type well Nwell. In FIG. 4C, only the boundaries of the N-type well Nwell are marked. One having ordinary skill in the art should understand that the first and second P-type wells Pwell occupy the remaining regions of the bitcell R22A.

Referring to FIGS. 4B and 4C, the bitcell includes semiconductor fins F each extending along the column direction. Semiconductor fins F include active regions, in which transistors of the bitcell R22/R22A are formed, are spaced apart from each other by, for example, an insulating layer such as shallow trench isolation (STI) (not shown).

Source, drain, and channel regions of the first pass-gate transistor PG1 and the first pull-down transistor PD1 of the bitcell R22 are made of the semiconductor fins F in the first P-type well Pwell. Source, drain, and channel regions of the second pass-gate transistor PG2 and the second pull-down transistor PD2 are made of the semiconductor fins F in the second P-type well Pwell. Source, drain, and channel regions of the first pull-up transistor PU1 and source, drain, and channel regions of the second pull-up transistor PU2 are made of the semiconductor fins F in the N-type well Nwell.

As shown in FIGS. 4B and 4C, the bitcell R22 includes a first gate electrode layer P1 that includes a first portion over the channel region of the first pass-gate transistor PG1, and a second portion over the channel regions of the second pull-up transistor PU2 and the second pull-down transistor PD2. The bitcell R22 further includes a second gate electrode layer P2 that includes a third portion over the channel region of the second pass-gate transistor PG2, and a fourth portion over the channel regions of the first pull-up transistor PU1 and the first pull-down transistor PD1. A pitch PP, in the column direction, of the first gate electrode layer P1 and the second gate electrode layer P2 includes a width of one of the first gate electrode layer P1 and the second gate electrode layer P2 and a distance, in the column direction, of the first gate electrode layer P1 and the second gate electrode layer P2. Although not shown, the gate electrode layers of other bitcells in the same bitcell regions 120 are repeatedly disposed and have the pitch PP in the column direction. The material for the gate electrode layers P1 and P2 can be poly-Si, poly-Si with silicide, Al, Cu, W, Ti, Ta, TiN, TaN, TiW, WN, TiAl, TiAlN, TaC, TaCN and TiSiN, or any other suitable conductive materials.

Figure 4D:
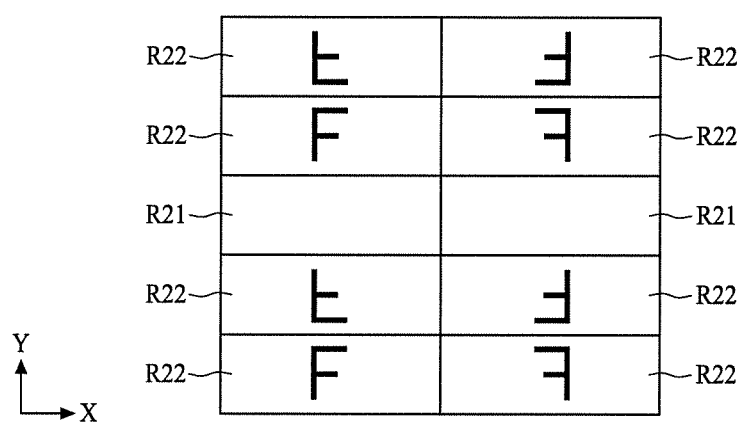
FIG. 4D illustrates a view of bitcells and strap cells.

As shown in FIG. 4D, one of two bitcells R22 in the same column sharing the same boundary is flipped with reference to another bitcell R22 based on the boundary between the two bitcells R22, and one of two bitcells R22 in the same row sharing the same boundary is flipped with reference to another bitcell R22 based on the boundary between the two bitcells R22. Letters "F" having different orientations represent relative orientations of the bitcells R22 with reference to each other. Although two strap cells R22 are disposed on each of opposite sides of each strap cell R21 in the column direction, the number of strap cells R22 disposed on the same side of each strap cell R21 is not limited to two and can be more than two, for example, 4, 16, 32, 64, 128, 256, or greater.

Figure 5A:
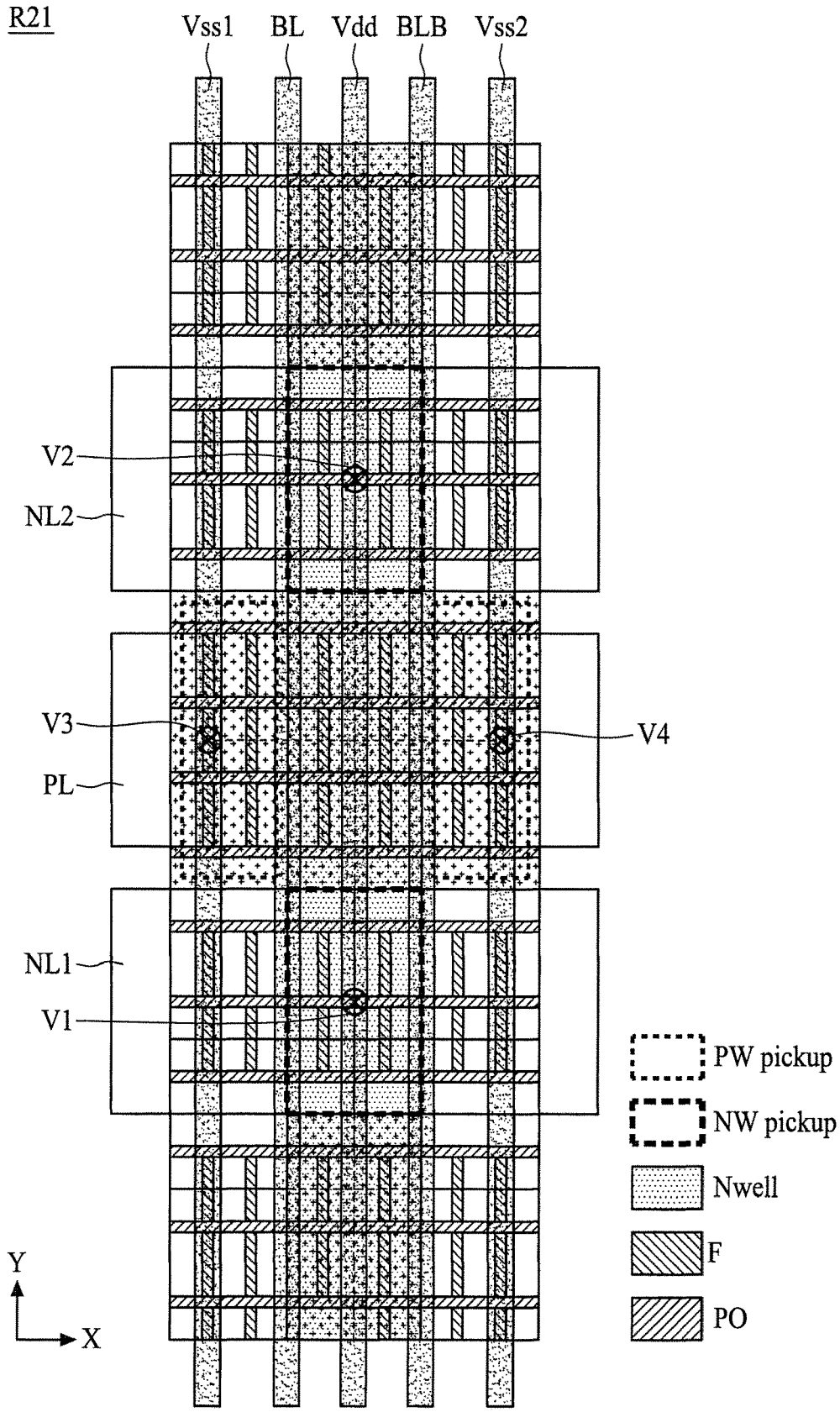
FIGS. 5A and 5B show a layout of a strap cell in FIG. 3, according to embodiments of the present disclosure.
Figure 5B:
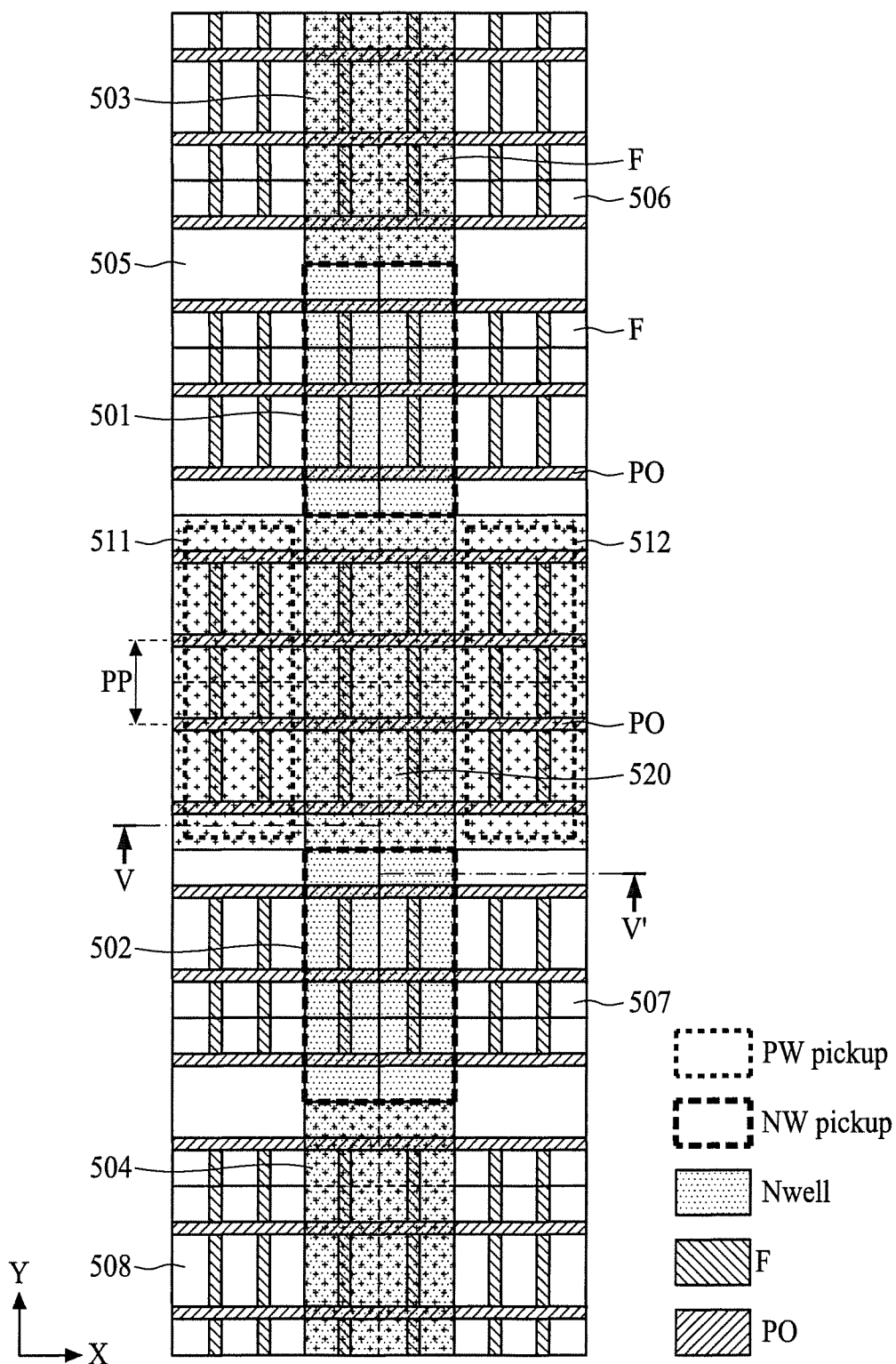
Figure 5C:
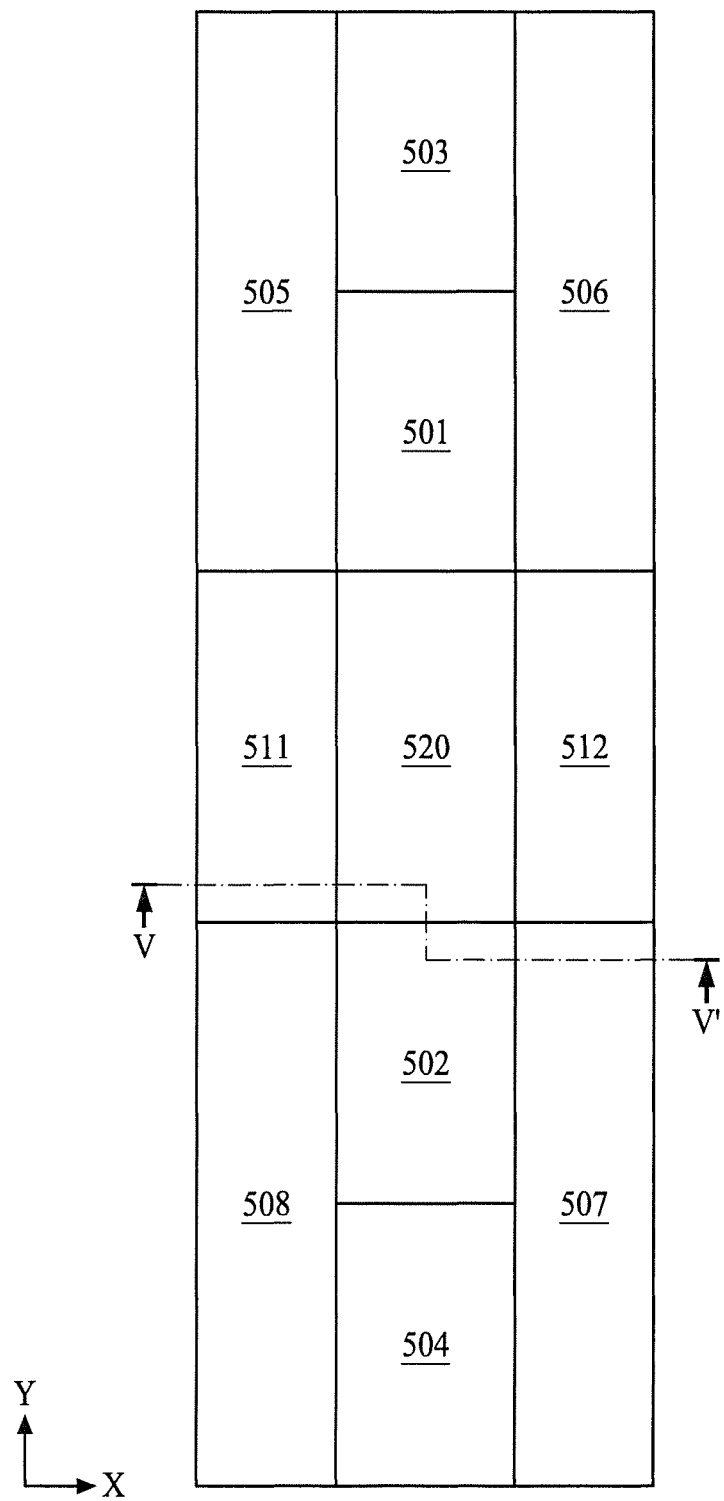
FIG. 5C shows regions of a strap cell, according to embodiments of the present disclosure.
Figure 5D:
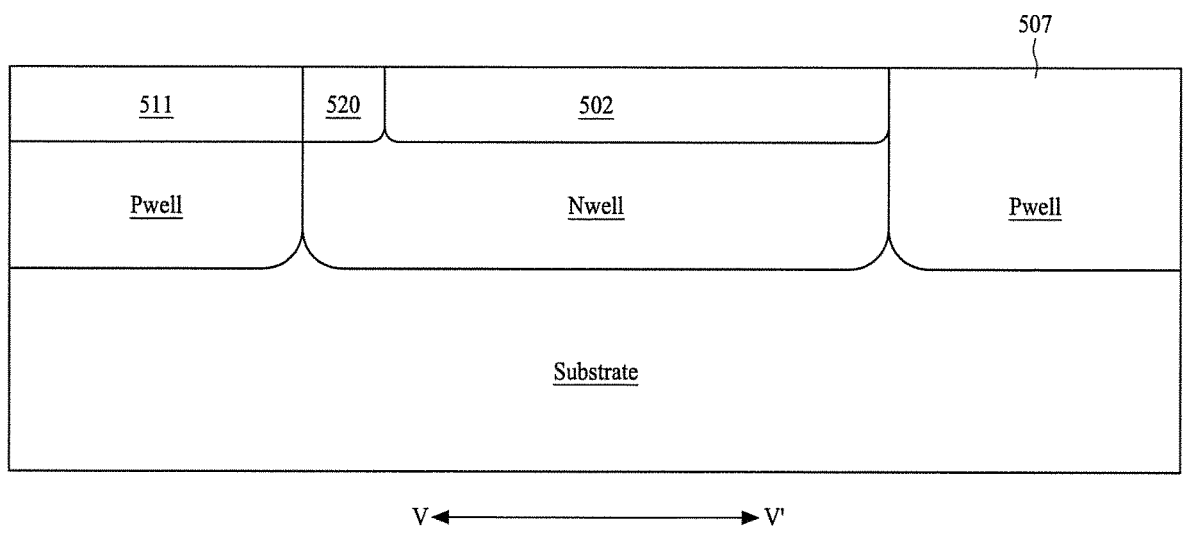
FIG. 5D shows a cross-sectional view of a substrate including wells and well pickup regions along line V-V' in FIGS. 5B and 5C.
Figure 5E:
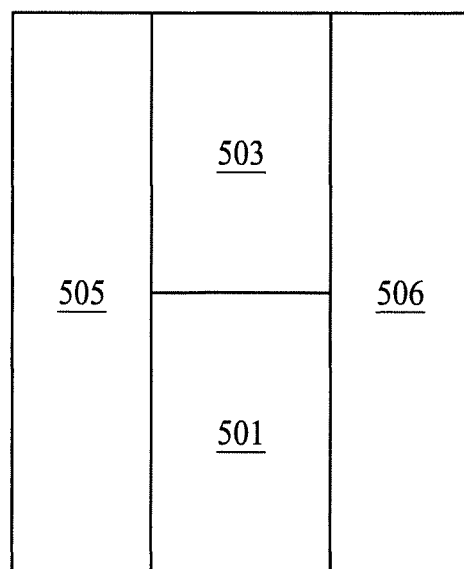
FIG. 5E shows regions of a strap cell, according to embodiments of the present disclosure.
Figure 5E:
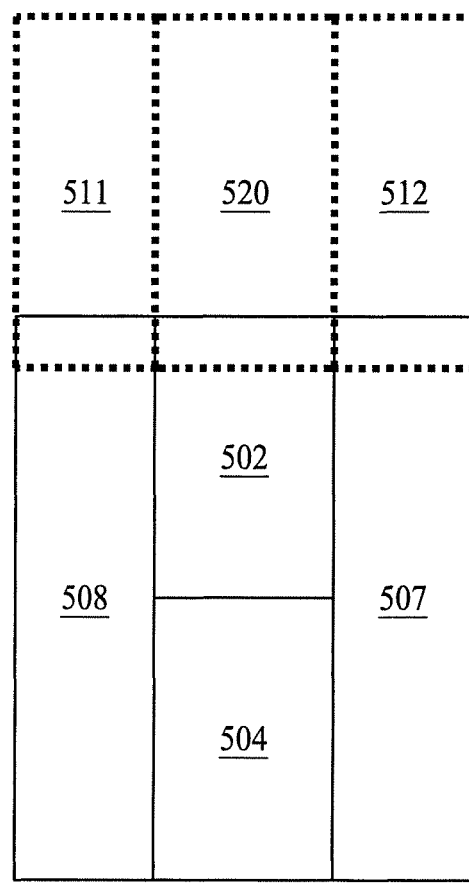

FIG. 5A shows a detailed layout of the strap cell R21 in FIG. 3. FIG. 5B shows a layout substantially the same as that shown in FIG. 5A, except that the layer for forming the power supply pattern Vss1, the bitline BL, the power supply pattern Vdd, the complementary bitline BLB, and the power supply pattern Vss2, the layer for forming the first and second N-well strap patterns NL1 and NL2 and the P-well strap pattern PL, and the vias V1-V4 between the two layers are omitted for convenience of illustration. FIG. 5C shows regions of the strap cell R21. FIG. 5D shows a cross-sectional view of a substrate including wells and well pickup regions along line V-V' in FIGS. 5B and 5C. FIG. 5E shows regions of the strap cell R21.

In the strap cell R21, respective semiconductor fins F are aligned to each other in the column direction and are also aligned to the respective semiconductor fins F in the bitcell R22 (shown in FIGS. 4B and 4C). Although the semiconductor fins F in the strap cell R21 are represented by a legend different from that used for the semiconductor fins F in the bitcell R22, all of the semiconductors fins F in the strap cell R21 and the bitcell R22 are formed on the same level by the same process with the same material.

The semiconductor fins F in the strap cell R21 may not be used to form transistors. However, even if transistors are formed based on the semiconductor fins F in the strap cell R21, these transistors, unlikely those in the bitcell R22, are not used to store data. For convenience, the semiconductor fins F in the strap cell R21 will be described as dummy semiconductor fins. In some embodiments, the dummy semiconductor fins F in the strap cell R21 are aligned in the column direction to the semiconductor fins F in the bitcell R22 in the same column; however, the length of the semiconductor fins F in the strap cell R21 can be the same as, or different from, those in the bitcell R22.

In the strap cell R21, the gate electrode layers PO are disposed in parallel with the first and second gate electrode layers P1 and P2 (shown in FIGS. 4B and 4C) of the bitcell R22 and extend along the row direction. Although the gate electrode layers PO in the strap cell R21 are represented by a legend different from that used in the first and second gate electrode layers P1 and P2 in the bitcell R22, all of the gate electrode layers PO in the strap cell R21 and all of the gate electrode layers P1 and P2 in the bitcell R22 are formed on the same level by the same process with the same material. Although each gate electrode layer PO in the strap cell R21 is a single continuous layer, the present disclosure is not limited thereto. In other embodiments, each of one or more gate electrode layers PO may include two or more sections aligned to each other but spaced apart from each other in the row direction. Since the gate electrode layers PO in the strap cell R21, unlikely those in the bitcell R22, are not used to form transistors to store data, the gate electrode layers PO in the strap cell R21 are dummy gate electrode layers which are repeatedly disposed with the pitch PP in the column direction, such that effects due to process variations in various bitcell regions 120 of the semiconductor device 100 may be suppressed.

Although not shown in the drawings, in the column direction, the gate electrode layers P1 and P2 of the two bitcells R22 disposed on the opposite sides of the strap cell R21 and the dummy gate electrode layers PO in the strap cell R21 are repeatedly arranged to have the same pitch PP.

In the present disclosure, patterns being repeatedly arranged in one direction means the patterns are positioned periodically based on a predetermined pitch in the one direction, although the length/width of each pattern in another direction perpendicular to the one direction can be the same as or different from each other.

Although only one pitch PP between two adjacent dummy gate electrode layers is labeled in FIG. 5B, the pitch between any other two adjacent dummy gate electrode layers is the same as the pitch PP, in some embodiments. In addition, although not shown, the gate electrode P1 or P2 of the bitcell R22 and the dummy gate electrode PO adjacent to the gate electrode P1 or P2 of the bitcell R22 also have the same pitch as the pitch PP.

Now referring to FIGS. 5B-5D, the strap cell R21 are divided to regions 501-508, 511, 512, and 520. In some embodiments, the regions 504, 502, 520, 501, and 503 are arranged in this order in the column direction and represent the N-type well Nwell in the strap cell R21. The region 504 is in direct contact with and aligned to the N-type well Nwell (shown in FIGS. 3, 4B, and 4C) in one bitcell R22 adjacent to the strap cell R21, and the region 503 is in direct contact with and aligned to the N-type well Nwell (shown in FIGS. 3, 4B, and 4C) in another bitcell R22 adjacent to the strap cell R21. In this case, the N-type wells Nwell in the strap cell R21 and the N-type wells Nwell in the bitcells R22 in the same column form one integral N-type well. Although not labeled in the drawings, the remaining regions 505-508, 511, and 512 represent P-type wells. The P-type wells in the strap cell R21 are connected to and aligned to the P-type wells Pwell (shown in FIGS. 4B and 4C) of the adjacent bitcells R22 in the column direction.

In some embodiments, the regions 501 and 502 in the N-type well Nwell are N-well pickup regions in which N-type impurities are heavily doped, and the regions 511 and 512 in the P-type well are P-well pickup regions in which P-type impurities are heavily doped.

In some embodiments, the N-well pickup regions 501 and 502 and the P-well pickup regions 511 and 512 surround a central region of the strap cell R21.

In some embodiments, the region 520 in the N-type well Nwell, disposed between the N-well pickup regions 501 and 502 in the column direction and also disposed between the P-well pickup regions 511 and 512 in the row direction, is heavily counter-doped with the P-type impurities during formation of the P-well pickup regions 511 and 512 when the regions 511, 512, and 520 as a whole are heavily doped with the P-type impurities. Because of counter-doping in the region 520, a well contact resistance and/or a well sheet resistance are relatively larger in the region 520, as compared to other non-counter-doped regions. In some embodiments, a doping concentration of P-type dopants in the counter-doped region 520 is greater than a doping concentration of N-type dopants in the N-type well Nwell. For example, the doping concentration of P-type dopants in the counter-doped region 520 is one order or greater the doping concentration of N-type dopants in the N-type well Nwell.

In the present disclosure, a region being heavily doped, such as an N-well/P-well pickup region, refers to a region at the top portion of the well, which has a doping concentration at least one order or greater a doping concentration in the well region prior to the heavily doping (or the bottom portion of the well region which the heavy doping may not reach).

The N-well pickup regions 501 and 502 are electrically connected to the power supply pattern Vdd through contacts therebetween, and the P-well pickup regions 511 and 512 are electrically connected to the power supply patterns Vss1 and Vss2 through contacts (not shown) therebetween, respectively. Referring to FIG. 5A, the power supply pattern Vdd is electrically connected to the first and second N-type well strap patterns NL1 and NL2 through vias V1 and V2 therebetween, respectively, and the power supply patterns Vss1 and Vss2 are electrically connected to the P-type well strap pattern PL through vias V1 and V2 therebetween, respectively. As such, the first and second N-type well strap patterns NL1 and NL2, as well as the power supply pattern Vdd, are electrically connected to the N-type well, at least through the N-well pickup regions 501 and 502, and the P-type well strap pattern PL, as well as the power supply patterns Vss1 and Vss2, is electrically connected to the P-type well, at least through the P-well pickup regions 511 and 512.

Referring to FIG. 5B, the strap cell R21 has a width in the column direction N (N is an integer) times the pitch PP of the gate electrode layers P1, P2 (P1 and P2 shown in FIGS. 4B and 4C), and PO, although the present disclosure is not limited thereto.

In some embodiments, a length in the column direction of the dummy semiconductor fins F in each of the N-type well pickup regions 501 and 502 is 2 pitches 2 PP, and the width in the column direction of each of the N-type well pickup regions 501 and 502 is more than 2 pitches 2 PP and less than 4 pitches 4 PP. In some embodiments, each of the N-type well pickup regions 501 and 502 includes two or more dummy gate electrode layers PO extending thereover.

Still referring to FIG. 5B, in some embodiments, a length in the column direction of the dummy semiconductor fins F in the P-type well pickup regions 511 and 512 is 3 pitches 3 PP, and the width in the column direction of the P-type well pickup regions 511 and 512 is more than 3 pitches 3 PP and less than 5 pitches 5 PP. In some embodiments, the P-type well pickup regions 511 and 512 include 4 or more dummy gate electrode layers PO extending thereover.

In some embodiments, the width in the column direction of the P-type well pickup regions 511 and 512 is greater than the width in the column direction of each of the N-type well pickup regions 501 and 502. Because the width in the column direction of the P-type well pickup regions 511 and 512 is increased with respect to the N-type well pickup regions 501 and 502 or with respect to a comparative example which has a relatively smaller width for the P-type well pickup regions, a well contact resistance and/or a well sheet resistance of the P-well pickup regions are reduced. In addition, two N-type well pickup regions 501 and 502 are disposed on opposite sides of the P-type well pickup regions 511 and 512, a total area of the N-type well pickup regions is increased, as compared to a comparative example in which only one N-type well pickup region is used. Accordingly, a well contact resistance and/or a well sheet resistance of the N-well pickup regions are reduced. According to some embodiments, the N-type well pickup regions 501 and 502 and the P-type well pickup regions 511 and 512 have reduced well contact resistance and/or reduced well sheet resistance, as compared to the comparative example, malfunction or performance degradation such as latch-up in the semiconductor device 100 can be suppressed or prevented.

The layout of the first and second N-well strap patterns NL1 and NL2 and the P-well strap pattern PL is not limited to that shown in FIG. 5A. For example, the first N-well strap pattern NL1, the P-well strap pattern PL, and the second N-well strap pattern NL2 having the same width are evenly distributed along the column direction in the entire region of the strap cell R21. According to some embodiments, the wordlines WL (shown in FIGS. 3 and 4B) of the bitcells R22, the first N-well strap pattern NL1, the P-well strap pattern PL, and the second N-well strap pattern NL2 having the same width are evenly distributed along the column direction in a combined region of the bitcells R22 and the strap cell R21.

Since the width, in the column direction, of the strap cell R21 is more than 3 times the width, in the column direction, of the bitcell R22, the available width in the column direction to route the first N-well strap pattern NL1, the P-well strap pattern PL, and the second N-well strap pattern NL2 is more than 3 times the wordline WL in each bitcell R22. Thus, in some embodiments, a width, in the column direction, of the wordline WL of the bitcell R22 is less than a width, in the column direction, of each of the first N-well strap pattern NL1, the P-well strap pattern PL, and the second N-well strap pattern NL2.

Still referring to FIG. 5B, in some embodiments, a length in the column direction of the dummy semiconductor fins F in the edge region 503 and 504 is from 2 pitches 2 PP to 2.5 pitches 2.5 PP. The edge regions 503 and 504 include 3 or more dummy gate electrode layers PO extending thereover.

In some embodiments, the width in the column direction of the strap cell R21 is 16 pitches 16 PP, although the present disclosure is not limited thereto.

Descriptions of the structures of the dummy semiconductor fins F and the dummy gate electrode layers PO in the remaining P-type well regions of the strap cell R21 can refer to those of the structures of the dummy semiconductor fins F and the dummy gate electrode layers PO in the N-type well regions adjacent thereto in the row direction, and thus will be omitted to avoid redundancy.

Although FIGS. 5B and 5C shows that the N-well pickup regions 501 and 502 are symmetrically disposed with respect to the P-type well pickup regions 511 and 512 or symmetrically disposed with respect to a combined region including the P-type well pickup regions 511 and 512 and the counter-doped region 520, the present disclosure is note limited thereto.

In some embodiments, the N-well pickup regions 501 and 502 are asymmetrically disposed with respect to the P-type well pickup regions 511 and 512 or asymmetrically disposed with respect to the combined region including the P-type well pickup regions 511 and 512 and the counter-doped region 520, due to a shift, a twist, or an expansion of an implantation window to heavily dope P-type impurities to form the P-type well pickup regions 511 and 512 and the counter-doped region 520 caused by process errors. For example, as shown in FIG. 5E, the P-type well pickup regions 511 and 512 and the counter-doped region 520 are shifted toward the N-well pickup region 501, causing the N-well pickup region 502 to have a counter-doped portion, represented by an overlapped portion of the regions 502 and the counter-doped region 520. However, since the N-type well pickup region 502 is unaffected, a change in the effective area in the entire N-type well pickup regions due to the counter-doping is relatively small. Thus, the strap cell R21 can still efficiently prevent or suppress voltage drop along the column direction, according to some embodiments.

On the other hand, if one of the N-well pickup regions is omitted and the shift, the twist, or the expansion of the implantation window to heavily dope P-type impurities to form the P-type well pickup regions 511 and 512 and the counter-doped region 520 reduces the affective area of the remaining one N-well pickup region, such a strap cell may not be able to efficiently prevent or suppress voltage drop along the column direction, due to an increase in the well contact resistance and/or a well sheet resistance in the remaining N-well pickup region.

Since the strap cells in the present disclosure include two N-type well pickup regions 501 and 502 respectively connected to the first and second N-well strap patterns NL1 and NL2, even if an implantation window to heavily dope N-type impurities to form the N-well pickup regions 501 and 502 or an implantation window to heavily dope P-type impurities to form the P-type well pickup regions 511 and 512 is shifted, twisted, or expanded to cause one of the N-type well pickup regions 501 and 502 to partially or completely overlap with a combined region including the P-type well pickup regions 511 and 512 and the counter-doped region 520, the other of the N-well pickup regions 501 and 502 does not overlap with the P-type well pickup regions 511 and 512 and the counter-doped region 520. Thus, the power supply pattern Vdd and one of the first and second N-well strap patterns NL1 and NL2 are still electrically connected to one of the N-well pickup regions 501 and 502 through vias and contacts therebetween.

As described above, if only one N-well pickup region is provided to a strap cell, and if an implantation window to heavily dope N-type impurities to form the N-well pickup region or an implantation window to heavily dope P-type impurities to form the P-type well pickup regions is shifted, twisted, or expanded to cause the only N-type well pickup region partially, or completely, overlapping with a combined region including the P-type well pickup regions and a counter-doped region between the P-type well pickup regions, the only N-well pickup region may have an increased resistance due to the counter-doping, reducing efficiency in preventing or suppressing voltage drop along the column direction. In this case, a relatively large number of strap cells are used for the bitcells in the same column, causing less efficient use of the area of the semiconductor device in making bitcells.

However, according to the present disclosure, although an extra area is used to implement the two N-well pickup regions and to implement the relative wider P-well pickup regions, the number of the strap cells in the same column is reduced, because each strap cell can efficiently provide well pickup for a greater number of the bitcells in the same column, when the well contact resistance and the well sheet resistance are reduced. Accordingly, the total area used to make the strap cells in the entire column is reduced. For example, in one embodiment, one strap cell R21 can be used for 128 bitcells, increased from 64 bitcells in a comparative example in which only one N-well pickup region is included. Accordingly, more area is available to make bitcells to increase storage capacity of the semiconductor device.

In the above described embodiments, the wordlines WL of the bitcells R22, and the first and second N-well strap patterns NL1 and NL2 and the P-well strap pattern PL are made of the same conductive layer, for example, the second metal layer. The present disclosure, however, is not limited thereto. In other embodiments, the wordlines WL of the bitcells R22 are made of a conductive layer different from the conductive layer used to make the first and second N-well strap patterns NL1 and NL2 and the P-well strap pattern PL. For example, the wordlines WL of the bitcells R22 are made of a third metal layer above the second metal layer, and the first and second N-well strap patterns NL1 and NL2 and the P-well strap pattern PL are made of the second metal layer, or vice versa.

Figure 6A:
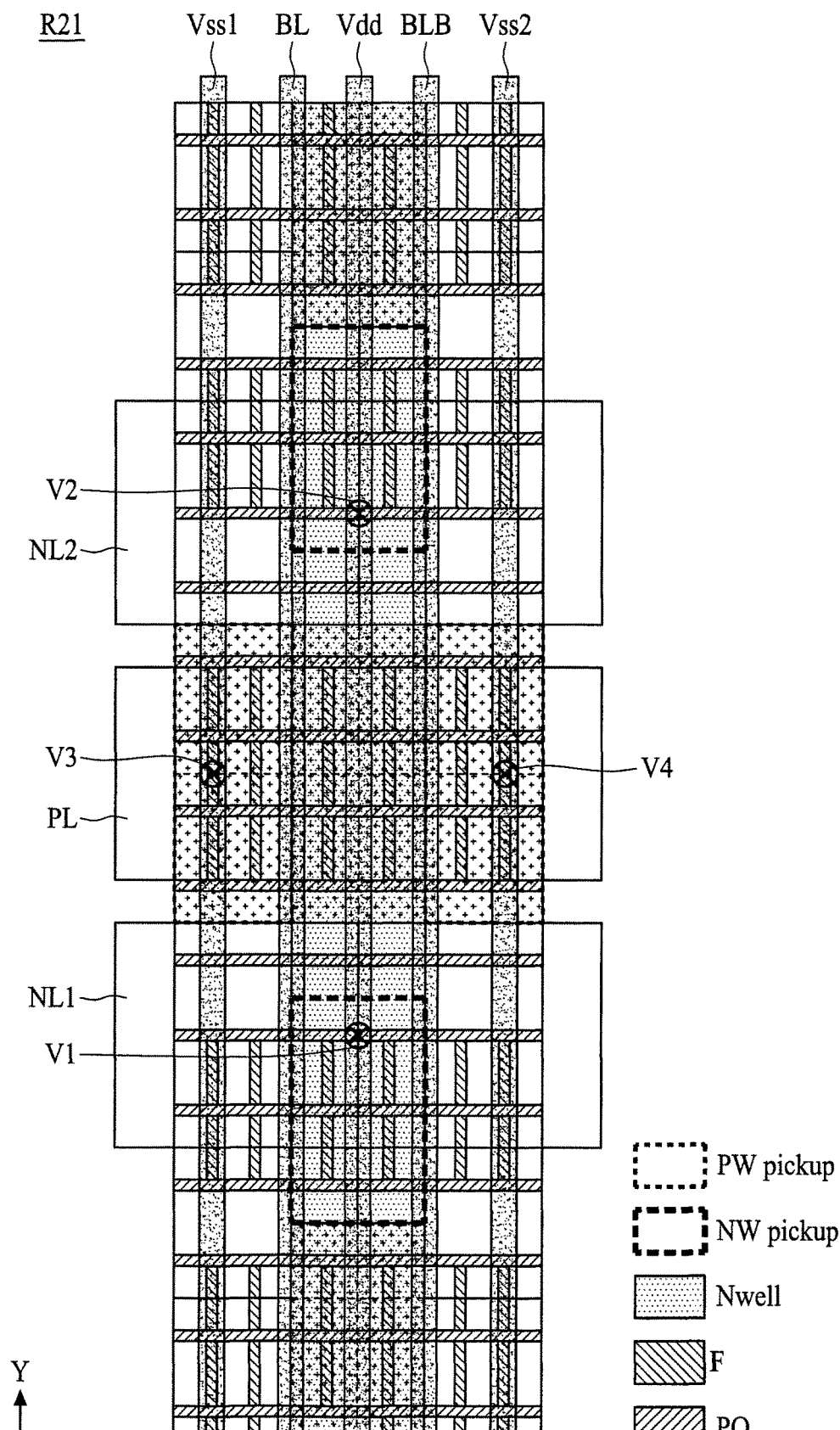
FIGS. 6A and 6B show another layout of a strap cell in FIG. 3, according to embodiments of the present disclosure.
Figure 6B:
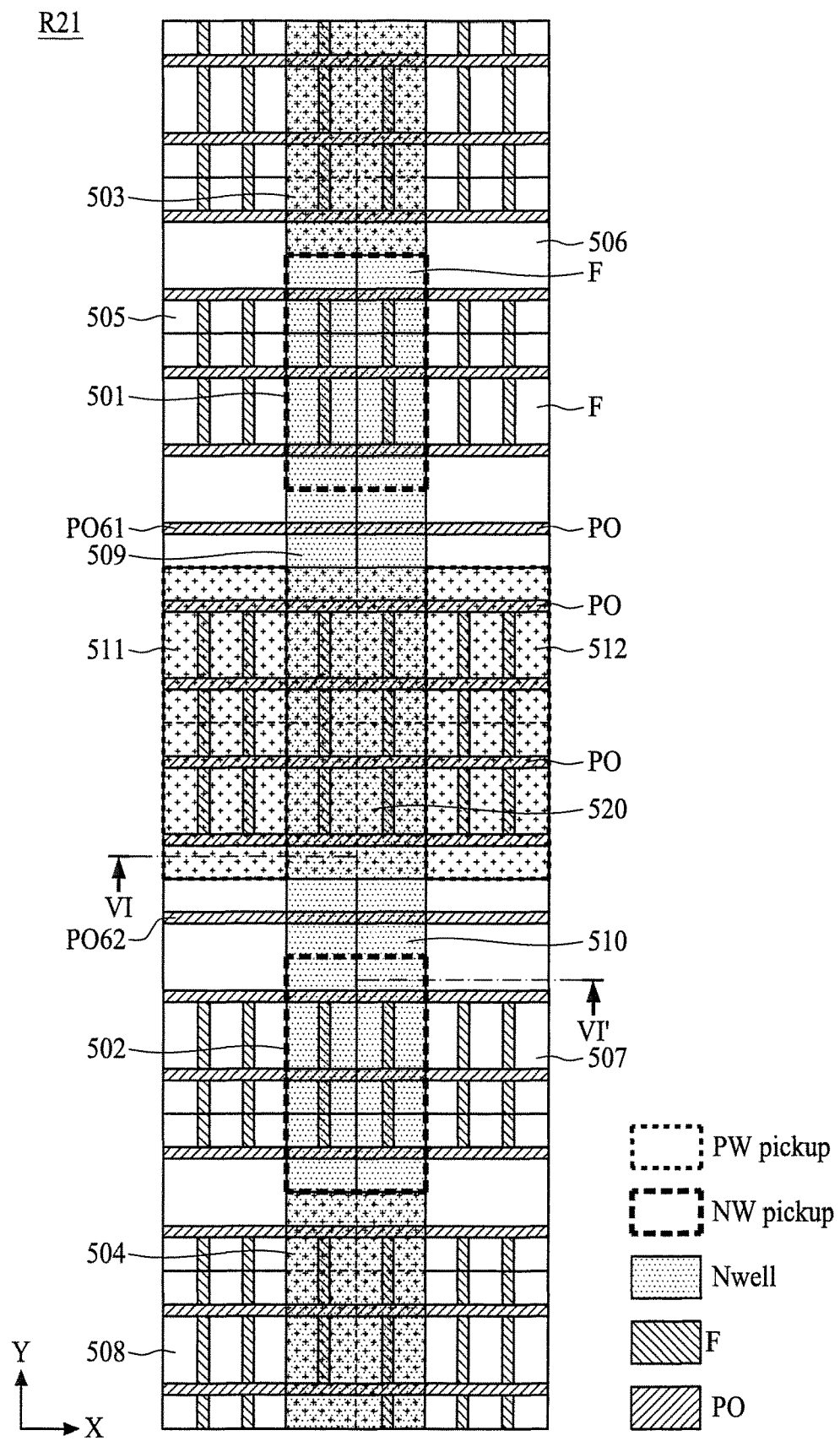
Figure 6C:
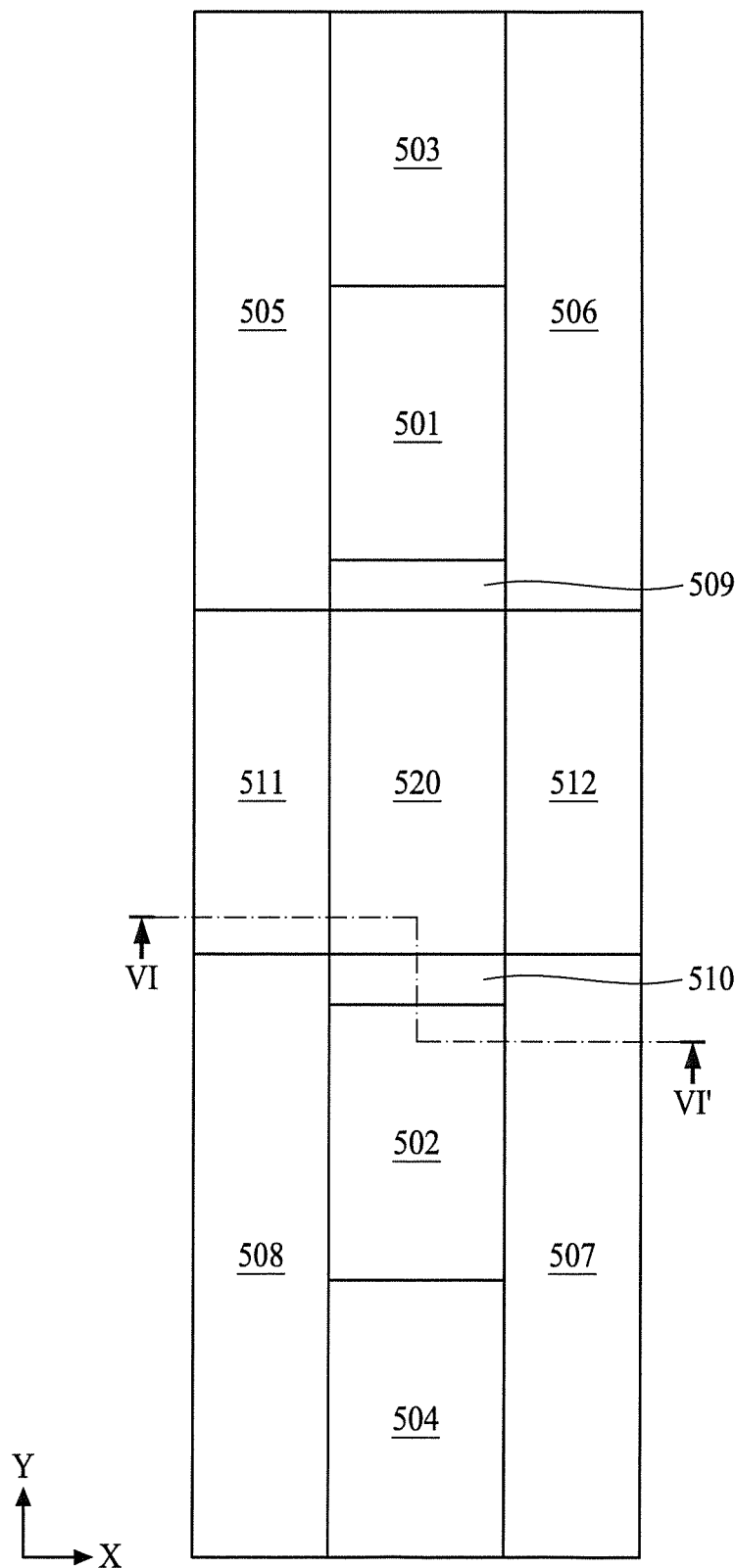
FIG. 6C shows regions of a strap cell, according to embodiments of the present disclosure.
Figure 6D:
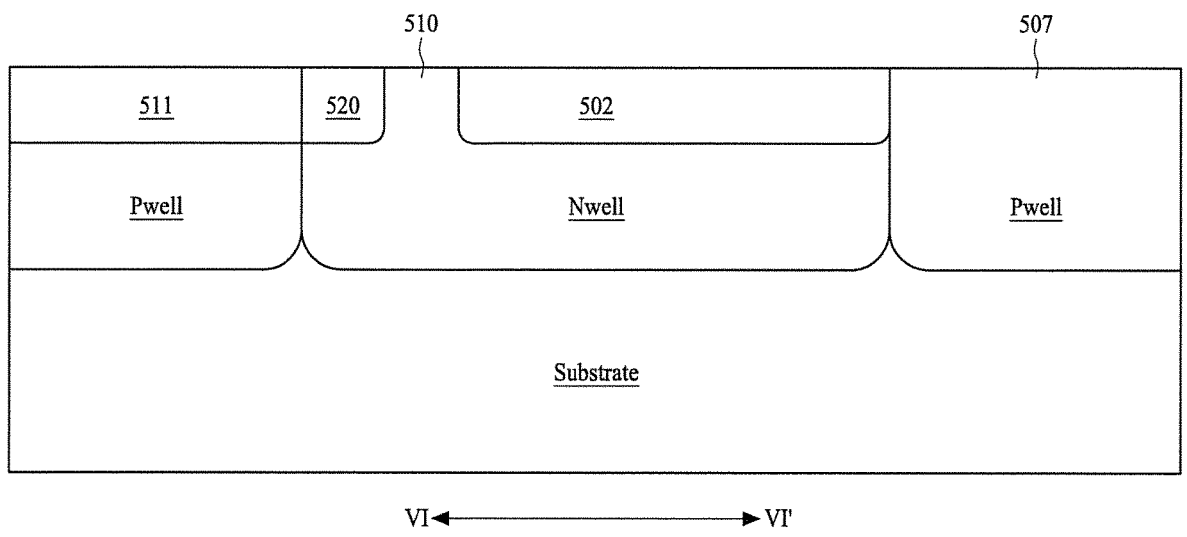
FIG. 6D shows a cross-sectional view of a substrate including wells and well pickup regions along line VI-VI' in FIGS. 6B and 6C.
Figure 6E:
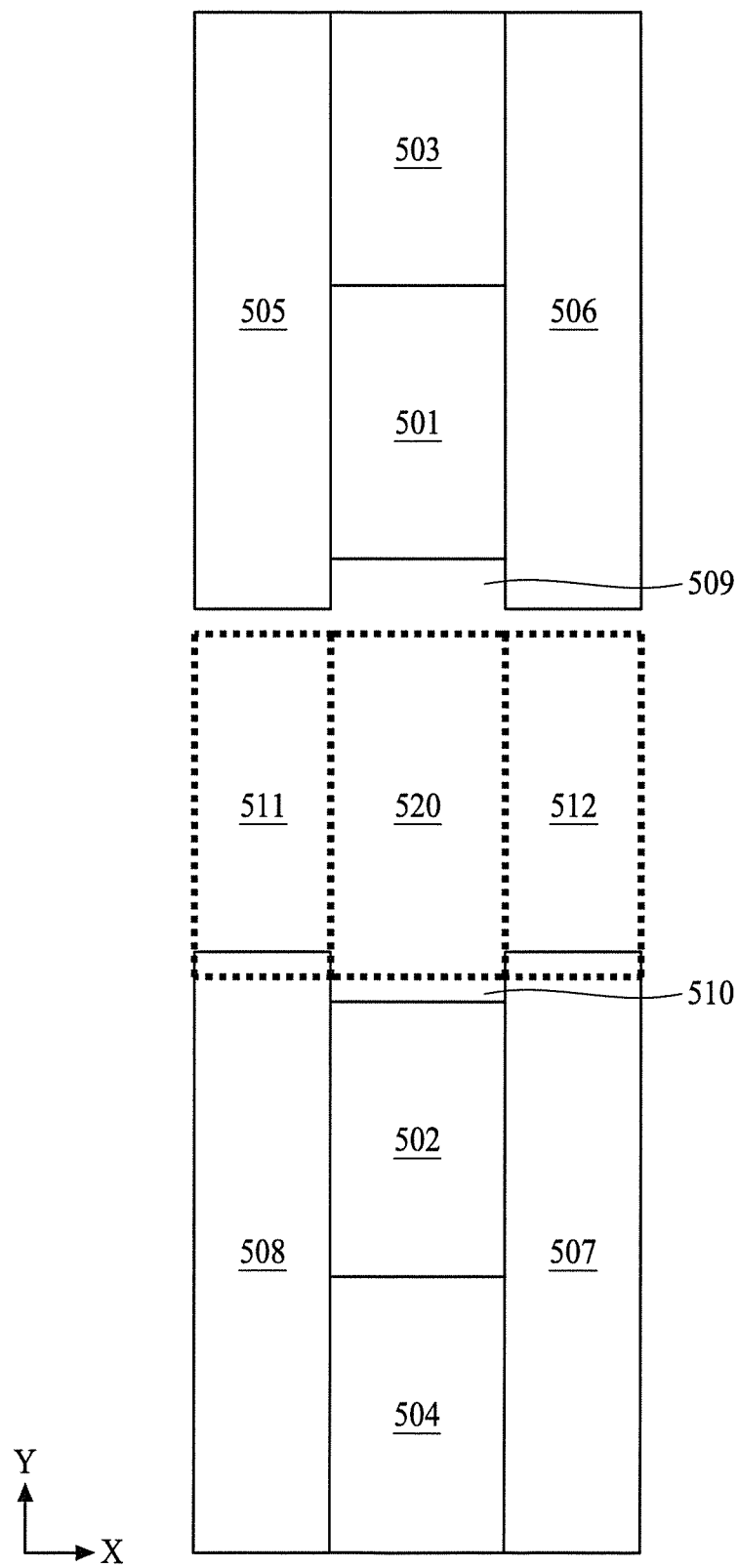
FIG. 6E shows regions of a strap cell, according to embodiments of the present disclosure.

FIG. 6A shows another layout of the strap cell R21 in FIG. 3. FIG. 6B shows a layout substantially the same as that shown in FIG. 6A, except that the layer for forming the power supply pattern Vss1, the bitline BL, the power supply pattern Vdd, the complementary bitline BLB, and the power supply pattern Vss2, the layer for forming the first and second N-well strap patterns NL1 and NL2 and the P-well strap pattern PL, and vias V1-V4 between the two layers are omitted, for convenience of illustration. FIG. 6C shows regions of the strap cell R21. FIG. 6D shows a cross-sectional view of a substrate including wells and well pickup regions along line VI-VI' in FIGS. 6B and 6C. FIG. 6E shows regions of the strap cell R21.

Referring to FIGS. 6A-6C, the layout of the strap cell R21 additionally includes a dummy gate electrode layer PO61 inserted between the N-well pickup region 501 and a combined region including the P-well pickup regions 511, 512, and the counter-doped region 520. Further, a dummy gate electrode layer PO62 is inserted between the N-well pickup region 502 and the combined region including the P-well pickup regions 511, 512 and the counter-doped region 520. The N-well pickup region 501 is spaced apart from the counter-doped region 520 by a region 509 which is a part of the N-type well Nwell of the strap cell R21, and the N-well pickup region 502 is spaced apart from the counter-doped region 520 by a region 510 which is a part of the N-type well Nwell of the strap cell R21.

In some embodiments, the width in the column direction of the strap cell R21 is 18 pitches 18 PP, although the present disclosure is not limited thereto. In other embodiments, two or more dummy gate electrode layers may be inserted between the N-well pickup regions 501 and the combined region including the P-well pickup regions 511 and 512 and the counter-doped region 520 and between the N-well pickup regions 502 and the combined region including the P-well pickup regions 511 and 512 and the counter-doped region 520.

Although FIGS. 6B and 6C shows that the N-well pickup regions 501 and 502 are symmetrically disposed with respect to the P-type well pickup regions 511 and 512, the present disclosure is note limited thereto. In other embodiments, the N-well pickup regions 501 and 502 are asymmetrically disposed with respect to the P-type well pickup regions 511 and 512 or asymmetrically disposed with respect to the combined region including the P-type well pickup regions 511 and 512 and the counter-doping region 520, due to a shift, a twist, or an expansion of an implantation window to heavily dope N-type impurities to form the N-well pickup regions 501 and 502 or an implantation window to heavily dope P-type impurities to form a combined region including the P-type well pickup regions 511 and 512 and the counter-doping region 520 caused by process errors. For example, because of the additional regions 509 and 510, even if an implantation window to heavily dope P-type impurities to form the P-type well pickup regions 511 and 512 is shifted toward the N-well pickup region 502 as shown in FIG. 6E, the counter-doped region 502 overlaps with the additional region 510, but is unlikely to overlap with the N-well pickup region 502. Thus, with, or without, a change in position of the implantation window, the N-well pickup regions 501 and 502 are unaffected.

Other descriptions of FIGS. 6A-6E can be referred to those of FIGS. 5A-5E, and thus will be omitted to avoid redundancy.

Figure 7:
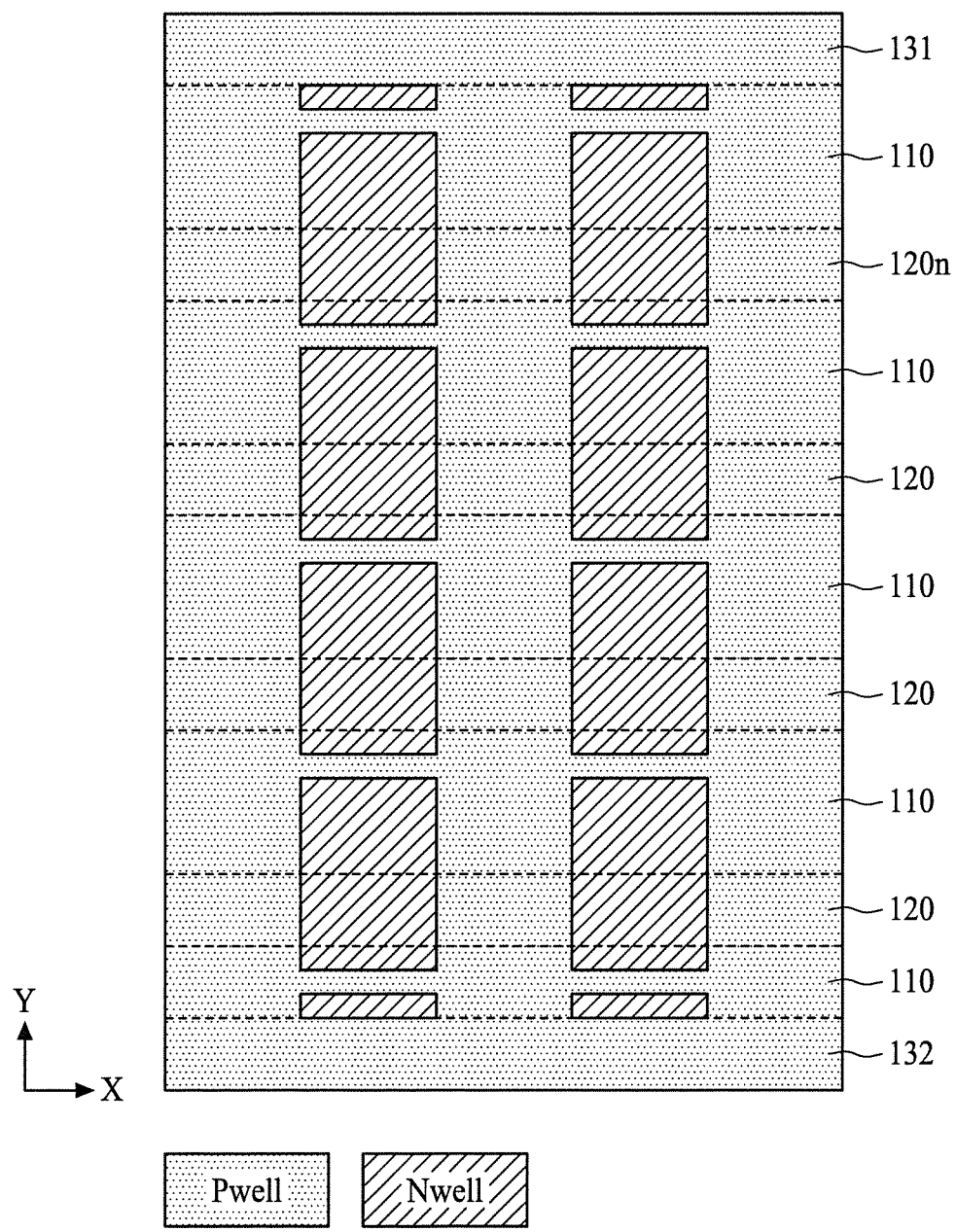
FIG. 7 shows another enlarged view of region R1 in FIG. 1, according to embodiments of the present disclosure.

FIG. 7 shows another enlarged view of region R1 in FIG. 1. For convenience of illustration, selective layers in region R1 are illustrated in FIG. 7, although the semiconductor device 100 according to embodiments of the present disclosure contains additional layers.

Referring to FIGS. 1 and 7, the upper edge cell region 131 includes a P-type well Pwell, the strap cell regions 110 and the bitcell regions 120 include P-type wells Pwell and N-type wells Nwell alternately arranged along the row direction, and the lower edge cell region 132 includes a P-type well Pwell. The P-type wells Pwell in the strap cell regions 110 and the bitcell regions 120, and the P-type wells Pwell in the upper and lower edge cell regions 131 and 132 form one continuous integral shape, among which the N-type wells Nwell of the strap cell regions 110 and the bitcell regions 120 having stripe structures are spaced apart from each other in the row direction. In some embodiments, the N-type wells Nwell in the same column are spaced apart from each other by portions of the P-type wells Pwell disposed in the strap region 110. In this case, in each column, the semiconductor device 100 includes a plurality of N-type wells Nwell, instead of one integral one N-type well Nwell as shown in the example shown in FIG. 2.

Although not shown, according to other embodiments, the upper edge cell region 131 includes an N-type well, the strap cell regions 110 and the bitcell regions 120 include P-type wells and N-type wells alternately arranged along the row direction, and the lower edge cell region 132 includes an N-type well. The N-type wells in the strap cell regions 110 and the bitcell regions 120, and the N-type wells in the upper and lower edge cell regions 131 and 132 form one continuous integral shape, among which the P-type wells of the strap cell regions 110 and the bitcell regions 120 having stripe structures are spaced apart from each other in the row direction. In some embodiments, the P-type wells Pwell in the same column are spaced apart from each other by portions of the N-type wells Nwell disposed in the strap region 110. In this case, in each column, the semiconductor device 100 includes a plurality of P-type wells Pwell.

Figure 8:
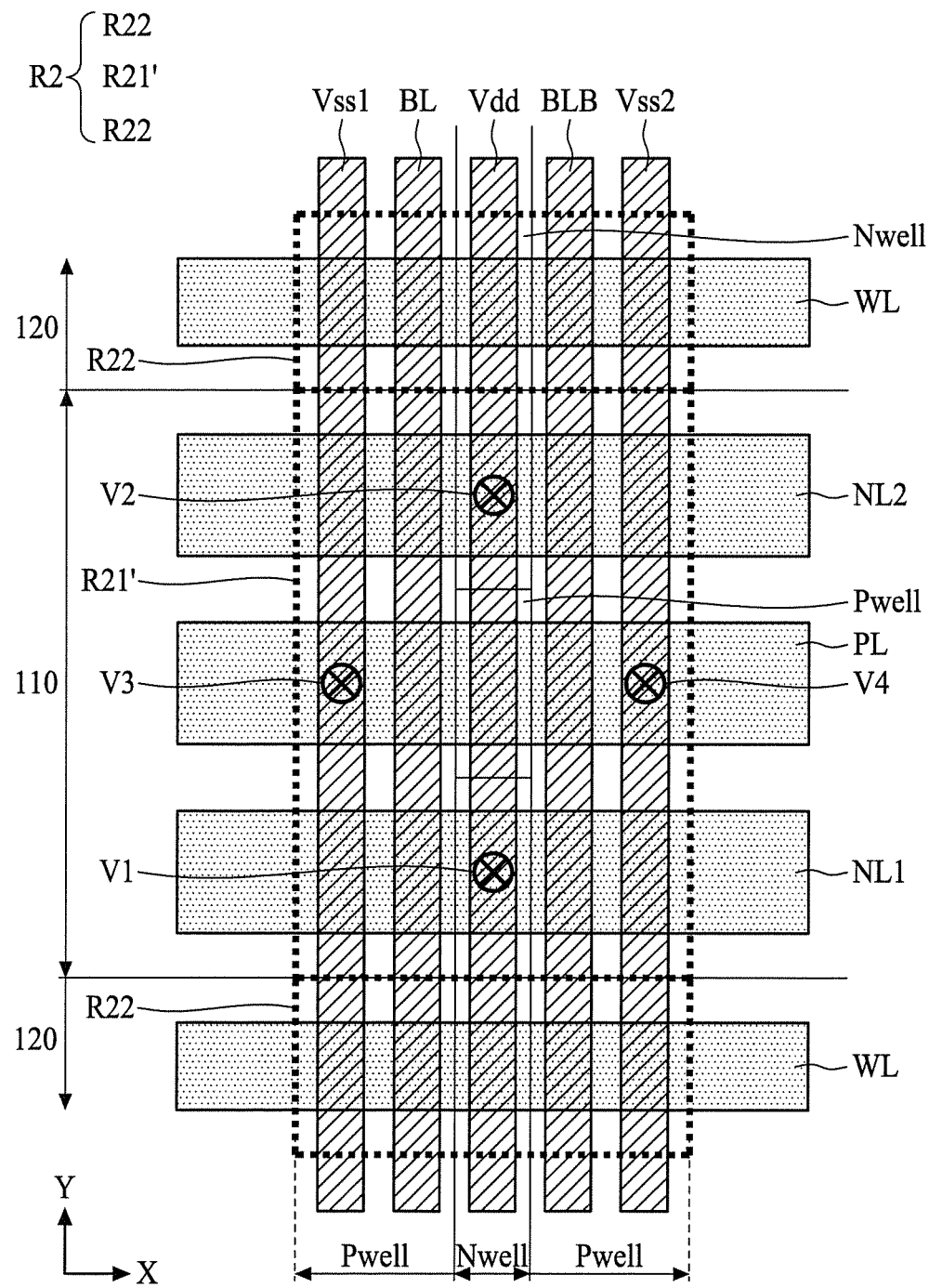
FIG. 8 shows another enlarged view of region R2 in FIG. 1, according to embodiments of the present disclosure.

FIG. 8 shows another enlarged view of region R2 in FIG. 1. For convenience of illustration, selective layers in the region R2 are illustrated in FIG. 8, although the semiconductor device 100 according to embodiments of the present disclosure contains additional layers not shown in FIG. 8.

The region R2 shown in FIG. 8 is substantially the same as that shown in FIG. 3, except that a central portion in strap cell R21' is a P-type well Pwell separating the N-type wells in the column direction to each other and connecting P-type wells Pwell in the row direction to each other. Other descriptions of FIG. 8 can be referred to those of FIG. 3, and thus will be omitted to avoid redundancy.

Figure 9A:
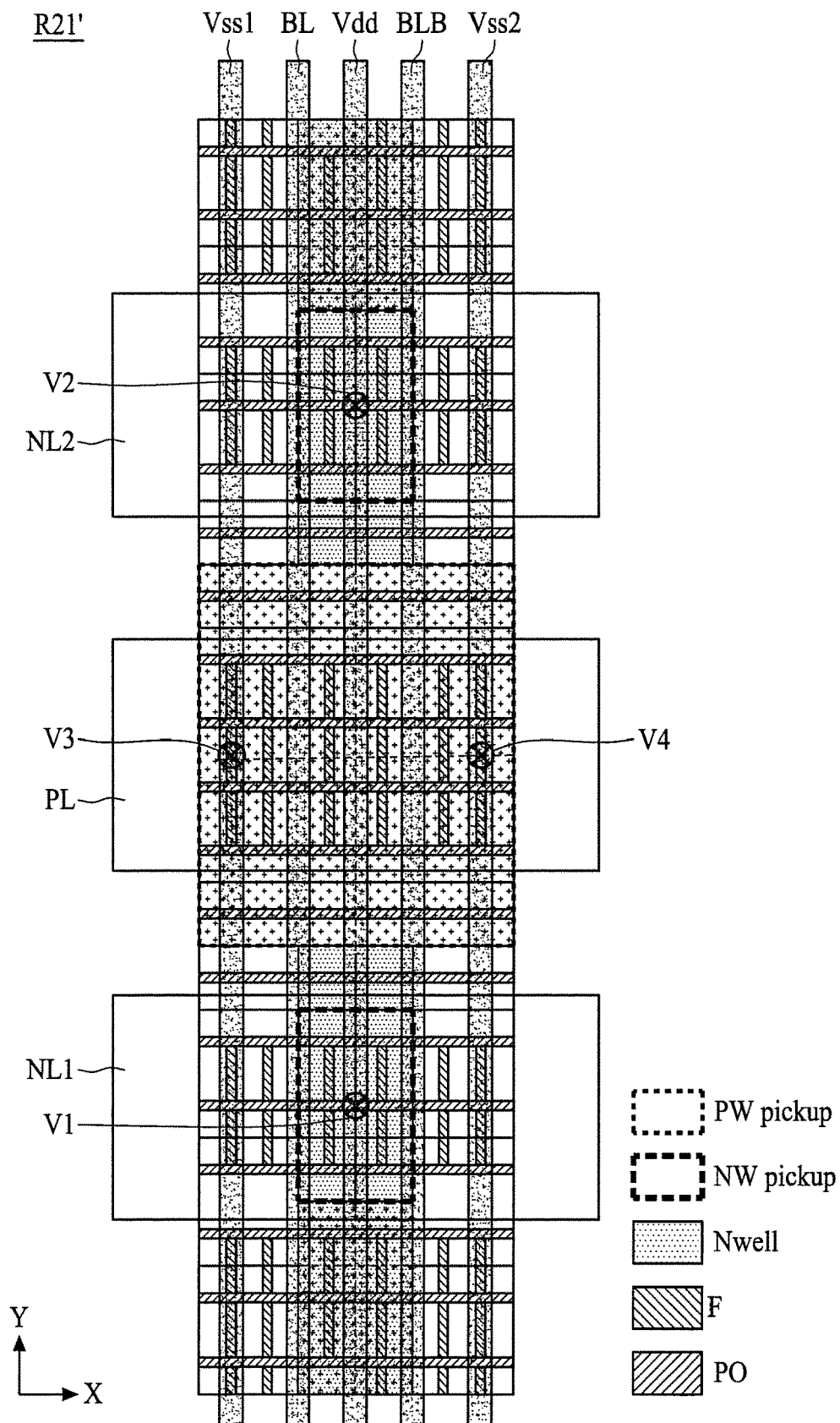
FIGS. 9A and 9B show a layout of a strap cell in FIG. 8, according to embodiments of the present disclosure.
Figure 9B:
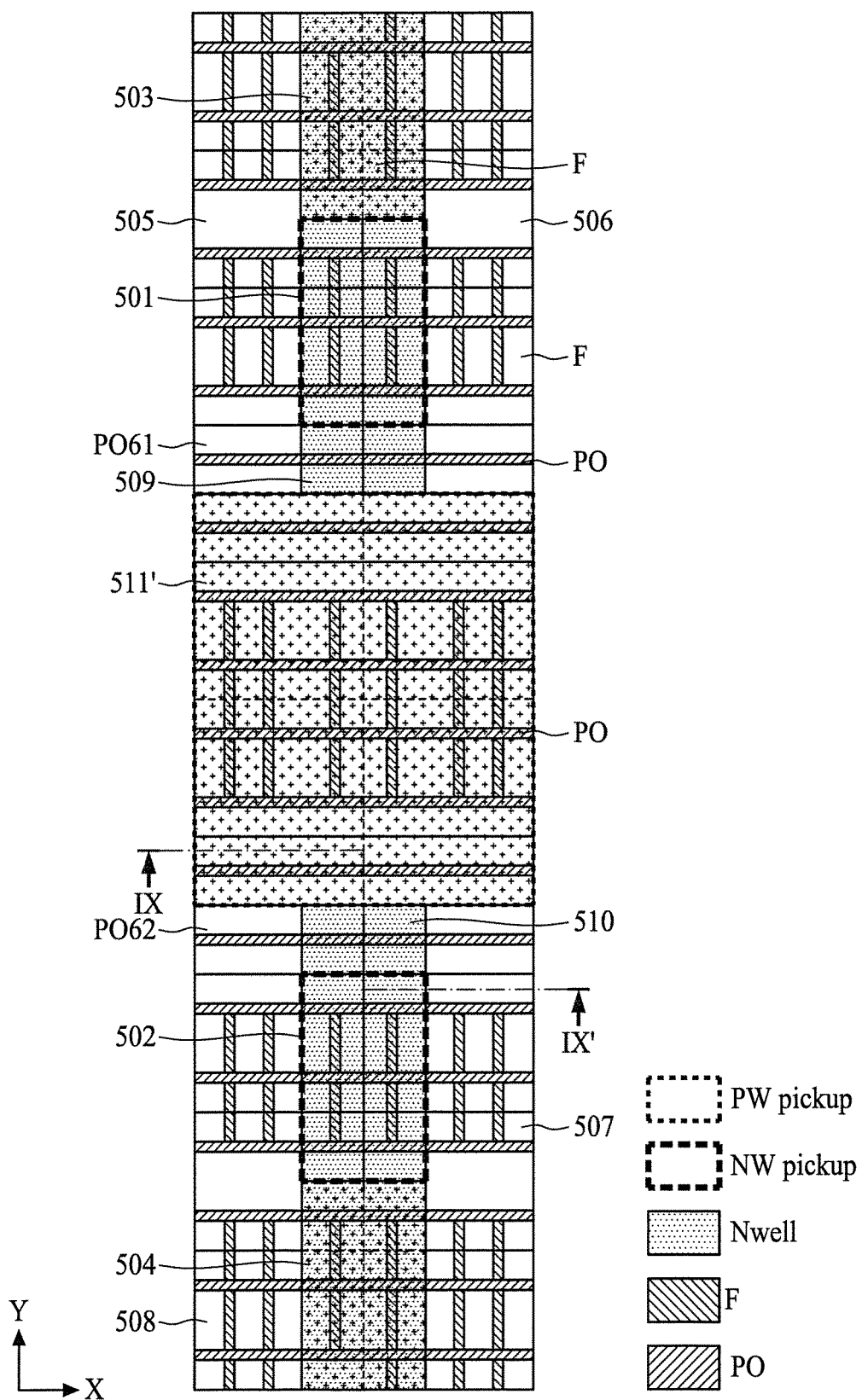
Figure 9C:
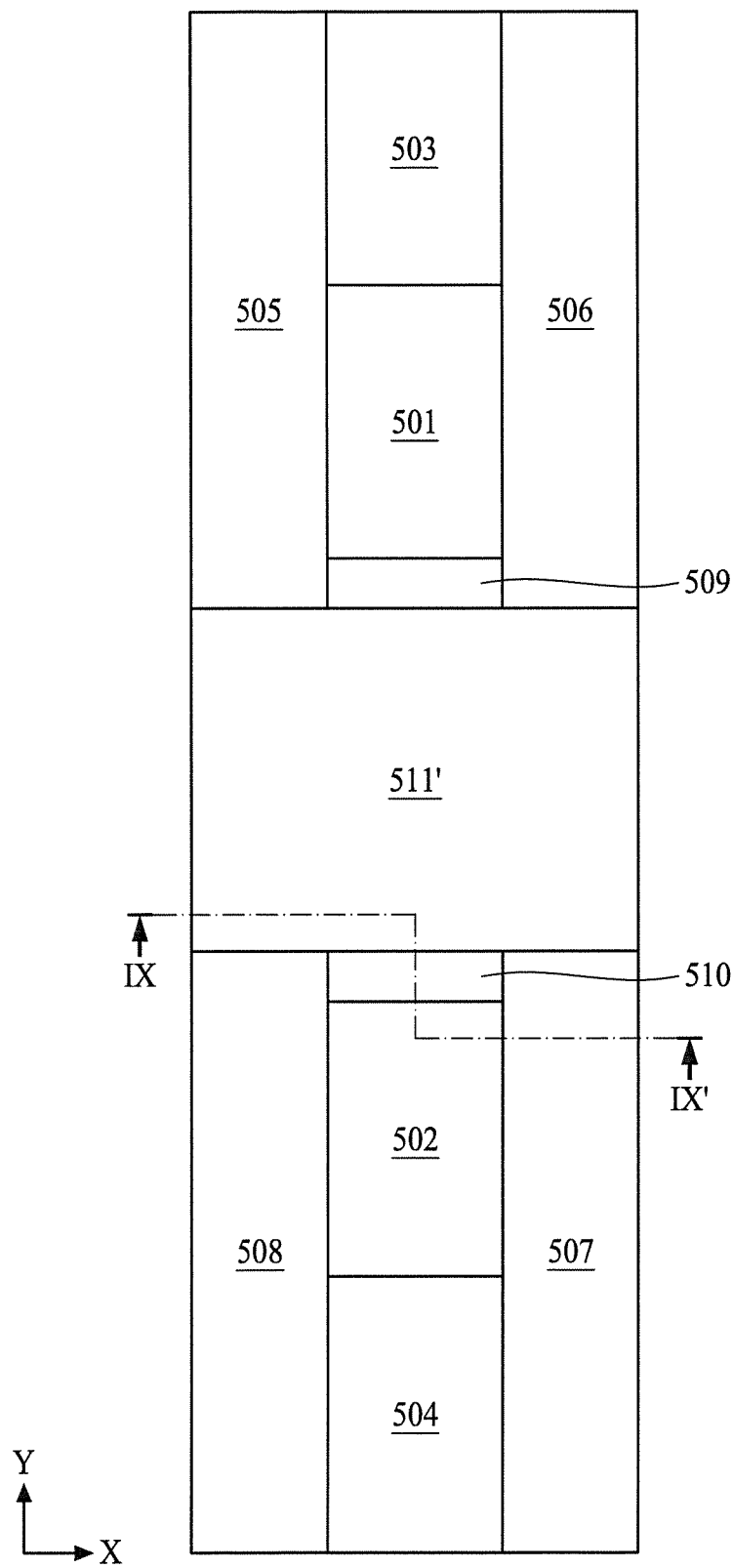
FIG. 9C shows regions of a strap cell, according to embodiments of the present disclosure.
Figure 9D:
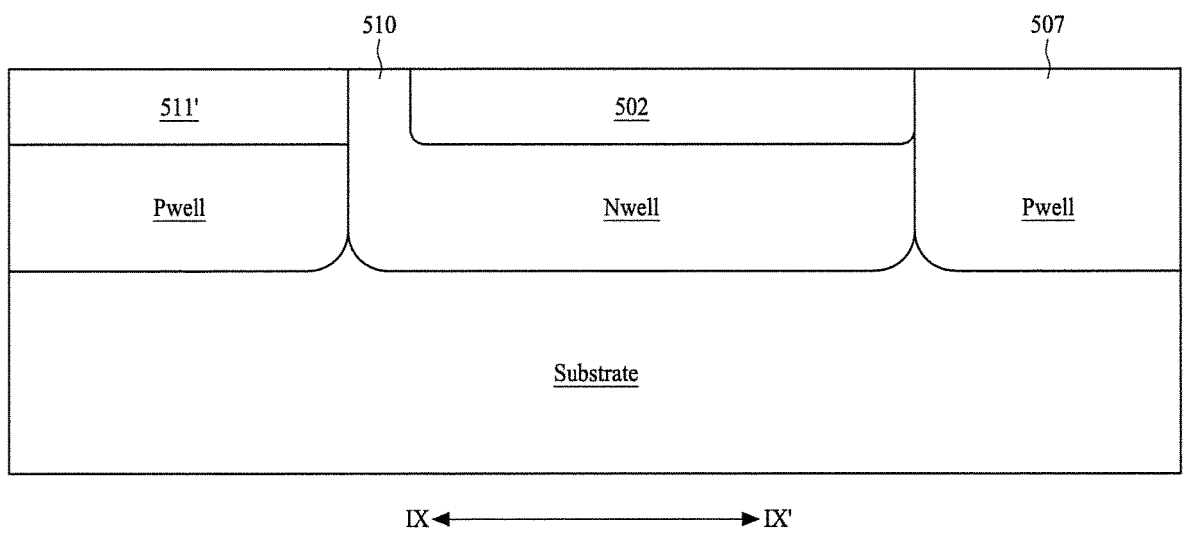
FIG. 9D shows a cross-sectional view of a substrate including wells and well pickup regions along line IX-IX' in FIGS. 9B and 9C.
Figure 9E:
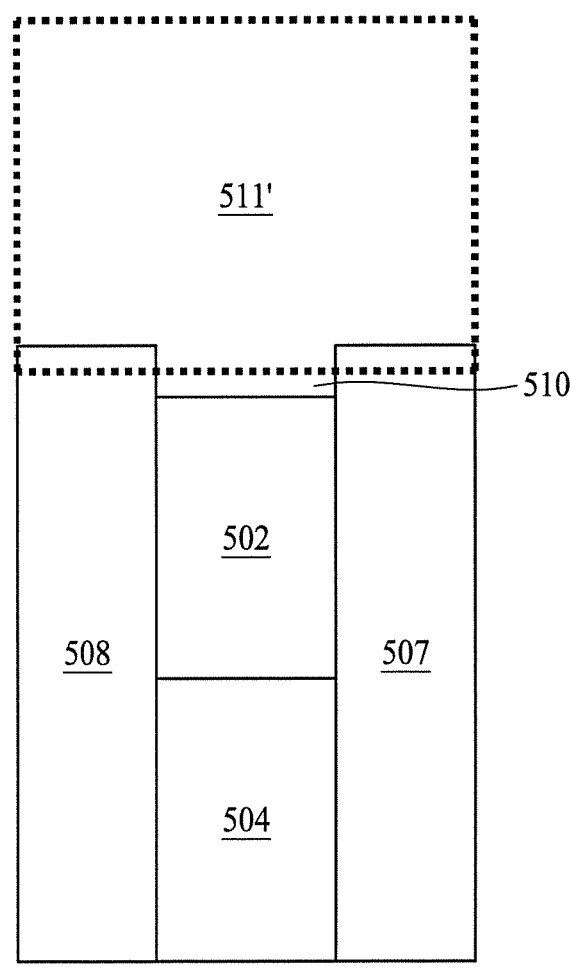
FIG. 9E shows regions of a strap cell, according to embodiments of the present disclosure.

FIG. 9A shows a detailed layout of the strap cell R21' in FIG. 8. FIG. 9B shows a layout substantially the same as that shown in FIG. 9A, except that the layer for forming the power supply pattern Vss1, the bitline BL, the power supply pattern Vdd, the complementary bitline BLB, and the power supply pattern Vss2, the layer for forming the first and second N-well strap patterns NL1 and NL2 and the P-well strap pattern PL, and vias V1-V4 between the two layers are omitted, for convenience of illustration. FIG. 9C shows regions of the strap cell R21'. FIG. 9D shows a cross-sectional view of a substrate including wells and well pickup regions along line IX-IX' in FIGS. 9B and 9C. FIG. 9E shows regions of the strap cell R21'.

In the strap cell R21', the P-well pickup region 511', based on the P-type well region, completely separates the N-well pickup regions 501 and 502 from each other and extends continuously between edges of the strap cell R21' in the row direction. In this case, the strap cell R21' includes one integral P-well pickup region, which is formed in the regions corresponding to the P-well pickup regions 511 and 512 and the counter-doped region 520. Since the P-type well extends continuously between edges of the strap cell R21' in the row direction, the counter-doped region 520 in the example shown in FIGS. 5A-5C does not exist in the strap cell R21'.

Referring to FIG. 9B, in some embodiments, a length in the column direction of the dummy semiconductor fins F in the P-type well pickup region 511' is 3 pitches 3 PP, and the width in the column direction of the P-type well pickup region 511' is more than 5 pitches 5 PP and less than 7 pitches 7 PP, for example, 6 pitches 6 PP. In some embodiments, the P-type well pickup region 511' includes 6 or more dummy gate electrode layers PO extending thereover.

Similar to the example shown in FIGS. 9A-9C, the strap cell R21' additionally include a dummy gate electrode layer PO61 inserted between the dummy gate electrode layers PO extending over the N-well pickup region 501 and the P-well pickup region 511'. Further, a dummy gate electrode layer PO62 is inserted between the dummy gate electrode layers PO extending over the N-well pickup region 502 and the P-well pickup region 511'. The N-well pickup region 501 is spaced apart from the P-well pickup region 511' by a region 509 which is a part of the N-type well Nwell of the strap cell R21', and the N-well pickup region 502 is spaced apart from the P-well pickup region 511' by a region 510 which is a part of the N-type well Nwell of the strap cell R21'.

Although not shown in FIGS. 9A-9C, the dummy gate electrode layer PO61 inserted between the dummy gate electrode layers PO extending over the N-well pickup region 501 and the P-well pickup region 511' and the dummy gate electrode layer PO62 inserted between the dummy gate electrode layers PO extending over the N-well pickup region 502 and the P-well pickup region 511' can be omitted, such that a width in the column direction of the strap cell R21' is reduced.

In some embodiments, the width in the column direction of the P-type well pickup region 511' is greater than the width in the column direction of each of the N-type well pickup regions 501 and 502. Because the width in the column direction of the P-type well pickup region 511' is increased with respect to the N-type well pickup regions 501 and 502 or with respect to a comparative example which has a relatively smaller width for the P-type well pickup region, a well contact resistance and/or a well sheet resistance of the P-well pickup region are reduced. In addition, two N-type well pickup regions 501 and 502 are disposed on opposite sides of the P-type well pickup region 511', a total area of the N-type well pickup regions is increased, as compared to a comparative example in which only one N-type well pickup region is used. Accordingly, a well contact resistance and/or a well sheet resistance of the N-well pickup regions are reduced. According to some embodiments, the N-type well pickup regions 501 and 502 and the P-type well pickup region 501 have reduced well contact resistance and/or reduced well sheet resistance, as compared to the comparative example, malfunction or performance degradation such as latch-up in the semiconductor device 100 can be suppressed or prevented.

In some embodiments, the width in the column direction of the strap cell R21' is 20 pitches 20 PP, although the present disclosure is not limited thereto.

Although FIGS. 9B and 9C show that the N-well pickup regions 501 and 502 are symmetrically disposed with respect to the P-type well pickup 511', the present disclosure is note limited thereto. In other embodiments, the N-well pickup regions 501 and 502 are asymmetrically disposed with respect to the P-type well pickup region 511', due to a shift, a twist, or an expansion of an implantation window to heavily dope N-type impurities to form the N-well pickup regions 501 and 502 or an implantation window to heavily dope P-type impurities to form the P-type well pickup region 511', caused by process errors. For example, because of the additional regions 509 and 510, even if an implantation window to heavily dope P-type impurities to form the P-type well pickup region 511' is shifted toward the N-well pickup region 502 as shown in FIG. 9D, a counter-doped region overlaps with the additional region 510, but is unlikely to overlap with the N-well pickup region 502. Thus, with or without, a change in position of the implantation window, the N-well pickup regions 501 and 502 are unaffected.

According to other embodiments, the additional regions 509 and 510 may be omitted.

Other descriptions of FIGS. 9A-9E can be referred to those of FIGS. 5A-5E and FIGS. 6A-6E, and thus will be omitted to avoid redundancy.

According to the present disclosure, although an extra area is used to implement the two N-well pickup regions and to implement a relative wider P-well pickup region, the number of the strap cells in the same column is reduced, because each strap cell can efficiently provide well pickup for a greater number of the bitcells in the same column, when the well contact resistance and the well sheet resistance are reduced. Accordingly, the total area used to make the strap cells in the entire column is reduced. For example, in one embodiment, one strap cell R21' can be used for 128 bitcells, increased from 64 bitcells in a comparative example in which only one N-well pickup region is included. Accordingly, more area is available to make bitcells to increase storage capacity of the semiconductor device.

In the above descriptions, the strap cell R21 (or strap cell R21') is described to be between two bitcells R22 in the same column. The present disclosure is not limited thereto. In other embodiments, the strap cell R21 (or strap cell R21') can be disposed adjacent to only the uppermost or the lowermost bitcell R22 in the column direction. Such configurations are substantially the same as those described with reference to FIGS. 5A-9E, except that only one bitcells R22 is disposed adjacent to the strap cell R21 (or strap cell R21') rather than two bitcells R22 disposed on opposite sides of the strap cell R21 (or strap cell R21'). Descriptions thereof thus will be omitted to avoid redundancy.

In other embodiments, the strap cell R21 (or strap cell R21') can be used as an upper edge cell and/or a lower edge cell in the column direction. In this case, the above-described upper and lower edge cell regions 131 and 132 can be omitted.

Figure 10A:
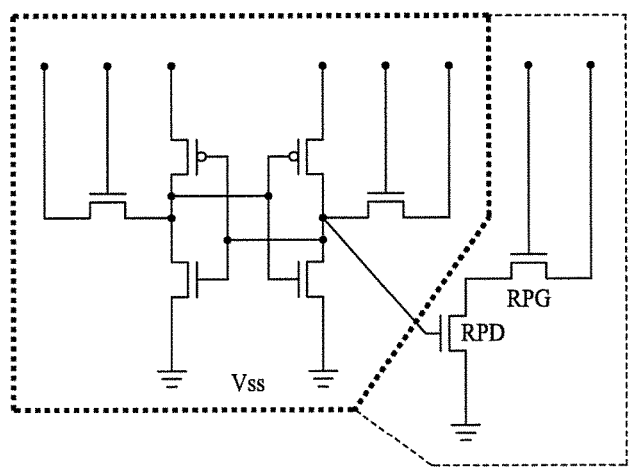
FIGS. 10A and 10B show circuit diagrams of bitcells to be implemented in a semiconductor device according to embodiments of the present disclosure.
Figure 10B:
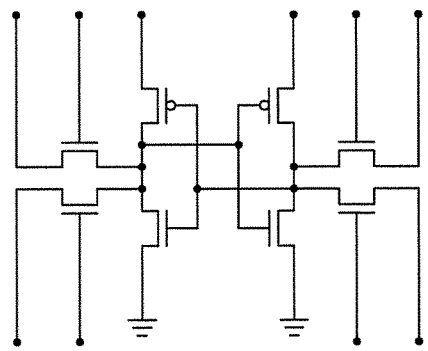

In the above descriptions, a 6 T SRAM bitcell is illustrated as an example to implement the bitcell R22 of the semiconductor device 100. According to other embodiments, the bitcell R22 can be implemented based on other types of bitcells, for example, an 8T SRAM bitcell including a read-port having read pass-gate transistor RPG and read pull-down transistor RPD, a circuit diagram of which is shown in FIG. 10A, or a dual-port SRAM bitcell, a circuit diagram of which is shown in FIG. 10B. One of ordinary skill in the art should understand the layouts of the 8 T SRAM bitcell and the dual-port SRAM bitcell, and descriptions thereof thus will be omitted.

In the above examples, fin field-effect transistors (FinFET) are described to implement the transistors in the semiconductor device. The present disclosure is not limited thereto. For example, the strap cell according to embodiments of the present disclosure can be implemented in a semiconductor device based on other types of transistors, such as planner transistors and gate-all-around transistors.

In the above examples, the strap cell according to embodiments of the present disclosure is implemented in the semiconductor device which, for example, is a memory device. The present disclosure should not limited thereto. For example, the strap cell according to embodiments can be implemented in other types of semiconductor devices in which logic pickup are used to provide bias voltages to N-type and/or P-type wells.

In some embodiments, N-well pickup regions of a strap cell are disposed on opposite sides of one or more P-type well pickup regions of the strap cell. Thus, even if a shift, a twist, or an expansion of an implantation window to heavily dope P-type impurities to form the one or more P-type well pickup regions caused by, for example, process errors, occurs, at least one of the N-well pickup regions is unaffected. Thus, a well contact resistance and/or a well sheet resistance are relatively larger in the region 520, as compared to other non-counter-doped regions. Thus, the strap cell can still efficiently prevent or suppress voltage drop along the column direction, according to some embodiments. Latch-up causing malfunction or performance degradation of the semiconductor device can be suppressed or prevented.

In some embodiments, although an extra area is used to implement N-well pickup regions disposed on opposite sides of one or more P-type well pickup regions and to increase a width of the one or more P-type well pickup regions in a strap cell, a total area required by all of the strap cells in the same column is reduced, because each strap cell is capable to work for a greater number of bitcells, as compared to an example in which only one N-well pickup region is implemented in a strap cell. Accordingly, more area is available to make bitcells to increase storage capacity of the semiconductor device, thereby increasing storage capacity of the semiconductor device.

In one embodiment, a semiconductor device includes: a first well having a first conductivity-type extending along a first direction; second and third wells having a second conductivity-type and disposed on opposite sides of the first well in a second direction; a first array of bitcells and a second array of bitcells disposed over the first to third wells; a strap cell disposed over the first to third wells and between the first and second arrays, the strap cell including: first and second well pickup regions having the first conductivity-type, disposed over the first well, spaced-apart from each other in the first direction, a doping concentration of the first and second well pickup regions being greater than a doping concentration of the first well, and third and fourth well pickup regions having the second conductivity-type and disposed over the second and third wells, respectively, and spaced-apart from each other in the second direction, a doping concentration of the third and fourth well pickup regions being greater than a doping concentration of the second and third wells; first and second conductive patterns electrically connected to the first and second well pickup regions and extending over the first and second well pickup regions, respectively; and a third conductive pattern electrically connected to the third and fourth well pickup regions and extending over the third and fourth well pickup regions. In one embodiment, a width, in the first direction, of each of the third and fourth well pickup regions is greater than a width, in the first direction, of each of the first and second well pickup regions. In one embodiment, the semiconductor further includes a first power supply pattern extending in the first direction over the first array, the strap cell, and the second array, and electrically connected to the first and second conductive patterns, and second and third power supply patterns each extending in the first direction over the first array, the strap cell, and the second array, and electrically connected to the third conductive pattern. In one embodiment, the first power supply pattern is disposed between the second and third power supply patterns and is electrically connected to source regions of first and second transistors, having the second conductivity-type, of the bitcells of the first and second arrays, the second power supply pattern is electrically connected to source regions of third transistors, having the first conductivity-type, of the bitcells of the first and second arrays, and the third power supply pattern is electrically connected to source regions of fourth transistors, having the first conductivity-type, of the bitcells of the first and second arrays. In one embodiment, the semiconductor device further includes: a first bitline extending in the first direction over the first array, the strap cell, and the second array, and electrically connected to source regions of fifth transistors, having the second conductivity-type, of the bitcells of the first and second arrays; and a second bitline extending in the first direction over the first array, the strap cell, and the second array, and electrically connected to source regions of sixth transistors, having the second conductivity-type, of the bitcells of the first and second arrays. In one embodiment, the semiconductor device further includes: gate electrode layers extending in the second direction in the first and second arrays; and dummy gate electrode layers extending in the second direction in the strap cell. The gate electrode layers and the dummy gate electrode layers are disposed on a same level and made of a same material. In one embodiment, the dummy gate electrode layers include: first dummy gate electrode layers extending over the first well pickup region; second dummy gate electrode layers extending over the second well pickup region; and third dummy gate electrode layers extending over the third and fourth well pickup regions. Each of the dummy gate electrode layers between the first and second dummy gate electrode layers extends over the third and fourth well pickup regions. In one embodiment, the dummy gate electrode layers include: first dummy gate electrode layers extending over the first well pickup region; second dummy gate electrode layers extending over the second well pickup region; third dummy gate electrode layers extending over the third and fourth well pickup regions; a fourth dummy gate electrode layer disposed between the first well pickup region and the third and fourth well pickup regions; and a fifth dummy gate electrode layer disposed between the second well pickup region and the third and fourth well pickup regions. In one embodiment, the dummy gate electrode layers include: first dummy gate electrode layers extending over the first well pickup region; second dummy gate electrode layers extending over the second well pickup region; and third dummy gate electrode layers extending over the third and fourth well pickup regions; sixth dummy gate electrode layers disposed between the first well pickup region and the first array; and seventh dummy gate electrode layers disposed between the second well pickup region and the second array. In one embodiment, the semiconductor device further includes a counter-doping region disposed between the first and second well pickup regions and between the third and fourth well pickup regions. The counter-doped region is disposed over the first well and doped with the second conductivity-type, a doping concentration of second conductivity-type dopants in the counter-doped region being greater than a doping concentration of first conductivity-type dopants in the first well.

In one embodiment, a semiconductor device includes: first and second wells having a first conductivity-type spaced apart from each other in a first direction; a third well having a second conductivity-type, and including a first portion disposed on one side of the first and second wells, a second portion disposed on another side of the first and second wells, and a third portion connecting the first and second portions to each other and separating the first and second wells from each other; a first array of bitcells disposed over the first well and the first and second portions of the third well; a second array of bitcells disposed over the second well and the first and second portions of the third well; a strap cell disposed over the first to third wells and between the first and second arrays, the strap cell including: first and second well pickup regions having the first conductivity-type, disposed over the first well and second well, respectively, and spaced-apart from each other in the first direction, a doping concentration of the first and second well pickup regions being greater than a doping concentration of the first and second wells, and a third well pickup region having the second conductivity-type and disposed over the third well and between the first and second well pickup regions, a doping concentration of the third well pickup region being greater than a doping concentration of the third well; first and second conductive patterns electrically connected to the first and second well pickup regions and extending over the first and second well pickup regions, respectively; and a third conductive pattern electrically connected to the third well pickup region and extending over the third pickup region. In one embodiment, the semiconductor device further includes: a first power supply pattern extending in the first direction over the first array, the strap cell, and the second array, and electrically connected to the first and second conductive patterns; and second and third power supply patterns each extending in the first direction over the first array, the strap cell, and the second array, and electrically connected to the third conductive pattern. In one embodiment, the first power supply pattern is disposed between the second and third power supply patterns and is electrically connected to source regions of first and second transistors, having the second conductivity-type, of the bitcells of the first and second arrays, the second power supply pattern and is electrically connected to source regions of third transistors, having the first conductivity-type, of the bitcells of the first and second arrays, the third power supply pattern and is electrically connected to source regions of fourth transistors, having the first conductivity-type, of the bitcells of the first and second arrays. The semiconductor device further includes: a first bitline extending in the first direction over the first array, the strap cell, and the second array, and electrically connected to source regions of fifth transistors, having the second conductivity-type, of the bitcells of the first and second arrays; and a second bitline extending in the first direction over the first array, the strap cell, and the second array, and electrically connected to source regions of sixth transistors, having the second conductivity-type, of the bitcells of the first and second arrays. In one embodiment, a width, in the first direction, of the third well pickup region is greater than a width, in the first direction, of each of the first and second well pickup regions. In one embodiment, the semiconductor device further includes: gate electrode layers extending in the second direction in the first and second arrays; and dummy gate electrode layers extending in the second direction in the strap cell. The gate electrode layers and the dummy gate electrode layers are disposed on a same level and made of a same material.

In one embodiment, a semiconductor device includes: first and second wells having a first conductivity-type spaced apart from each other in a first direction; a third well having a second conductivity-type, and including a first portion disposed on one side of the first and second wells, a second portion disposed on another side of the first and second wells, and a third portion connecting the first and second portions to each other and separating the first and second wells from each other; bitcells disposed over the first well and the first and second portions of the third well; a strap cell disposed over the first to third wells, the strap cell including: first and second well pickup regions having the first conductivity-type, disposed over the first well and second well, respectively, and spaced-apart from each other in the first direction, a doping concentration of the first and second well pickup regions being greater than a doping concentration of the first and second wells, and a third well pickup region having the second conductivity-type and disposed over the third well and between the first and second well pickup regions, a doping concentration of the third well pickup region being greater than a doping concentration of the third well; first and second conductive patterns electrically connected to the first and second well pickup regions and extending over the first and second well pickup regions, respectively; and a third conductive pattern electrically connected to the third well pickup region and extending over the third pickup region. The bitcells are disposed on only one side of the strap cell. In one embodiment, the semiconductor device further includes: a first power supply pattern extending in the first direction over the bitcells and the strap cell, and electrically connected to the first and second conductive patterns; and second and third power supply patterns each extending in the first direction over the bitcells and the strap cell, and electrically connected to the third conductive pattern. In one embodiment, the first power supply pattern is disposed between the second and third power supply patterns and is electrically connected to source regions of first and second transistors, having the second conductivity-type, of the bitcells, the second power supply pattern and is electrically connected to source regions of third transistors, having the first conductivity-type, of the bitcells, the third power supply pattern and is electrically connected to source regions of fourth transistors, having the first conductivity-type, of the bitcells. The semiconductor device further includes: a first bitline extending in the first direction over the bitcells and the strap cell, and electrically connected to source regions of fifth transistors, having the second conductivity-type, of the bitcells; and a second bitline extending in the first direction over the bitcells and the strap cell, and electrically connected to source regions of sixth transistors, having the second conductivity-type, of the bitcells. In one embodiment, a width, in the first direction, of the third well pickup region is greater than a width, in the first direction, of each of the first and second well pickup regions. In one embodiment, the semiconductor device further includes: gate electrode layers extending in the second direction in the first and second arrays; and dummy gate electrode layers extending in the second direction in the strap cell. The gate electrode layers and the dummy gate electrode layers are disposed on a same level and made of a same material.

The term "embodiment" or "embodiments" described above does not refer to the same embodiment or the same embodiments, and is provided to emphasize a particular feature or characteristic different from that of other embodiment or embodiments. One of ordinary skill in the art should understand that "embodiment" or "embodiments" described above can be considered to be able to be implemented by being combined in whole or in part with one another, unless an opposite or contradictory description is provided.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first well having a first conductivity-type and extending along a first direction;
second and third wells having a second conductivity-type and disposed on opposite sides of the first well in a second direction;
a first array of bitcells and a second array of bitcells disposed over the first to third wells;
a strap cell disposed over the first to third wells and between the first and second arrays, the strap cell comprising:
first and second well pickup regions having the first conductivity-type and disposed over the first well and spaced-apart from each other in the first direction, a doping concentration of the first and second well pickup regions being greater than a doping concentration of the first well; and
third and fourth well pickup regions having the second conductivity-type different from the first conductivity-type and disposed over the second and third wells, respectively, and spaced-apart from each other in the second direction, a doping concentration of the third and fourth well pickup regions being greater than a doping concentration of the second and third wells;
first and second conductive patterns electrically connected to the first and second well pickup regions and extending over the first and second well pickup regions, respectively; and
a third conductive pattern electrically connected to the third and fourth well pickup regions and extending over the third and fourth well pickup regions.

2. The semiconductor device of claim 1, wherein a width, in the first direction, of each of the third and fourth well pickup regions is greater than a width, in the first direction, of each of the first and second well pickup regions.

3. The semiconductor device of claim 1, further comprising:
a first power supply pattern extending in the first direction over the first array, the strap cell, and the second array, and electrically connected to the first and second conductive patterns; and
second and third power supply patterns each extending in the first direction over the first array, the strap cell, and the second array, and electrically connected to the third conductive pattern.

4. The semiconductor device of claim 3, wherein:
the first power supply pattern is disposed between the second and third power supply patterns and is electrically connected to source regions of first and second transistors, having the second conductivity-type, of the bitcells of the first and second arrays,
the second power supply pattern is electrically connected to source regions of third transistors, having the first conductivity-type, of the bitcells of the first and second arrays, and
the third power supply pattern is electrically connected to source regions of fourth transistors, having the first conductivity-type, of the bitcells of the first and second arrays.

5. The semiconductor device of claim 4, further comprising:
a first bitline extending in the first direction over the first array, the strap cell, and the second array, and electrically connected to source regions of fifth transistors, having the second conductivity-type, of the bitcells of the first and second arrays; and
a second bitline extending in the first direction over the first array, the strap cell, and the second array, and electrically connected to source regions of sixth transistors, having the second conductivity-type, of the bitcells of the first and second arrays.

6. The semiconductor device of claim 1, further comprising:
gate electrode layers extending in the second direction in the first and second arrays; and
dummy gate electrode layers extending in the second direction in the strap cell,
wherein the gate electrode layers and the dummy gate electrode layers are disposed on a same level and made of a same material.

7. The semiconductor device of claim 6, wherein the dummy gate electrode layers include:
first dummy gate electrode layers extending over the first well pickup region;
second dummy gate electrode layers extending over the second well pickup region; and
third dummy gate electrode layers extending over the third and fourth well pickup regions, and
each of the dummy gate electrode layers, which is disposed between the first and second dummy gate electrode layers, extends over the third and fourth well pickup regions.

8. The semiconductor device of claim 6, wherein the dummy gate electrode layers include:
first dummy gate electrode layers extending over the first well pickup region;
second dummy gate electrode layers extending over the second well pickup region;
third dummy gate electrode layers extending over the third and fourth well pickup regions;
a fourth dummy gate electrode layer disposed between the first well pickup region and the third and fourth well pickup regions; and
a fifth dummy gate electrode layer disposed between the second well pickup region and the third and fourth well pickup regions.

9. The semiconductor device of claim 6, wherein the dummy gate electrode layers include:
first dummy gate electrode layers extending over the first well pickup region;
second dummy gate electrode layers extending over the second well pickup region; and
third dummy gate electrode layers extending over the third and fourth well pickup regions;
sixth dummy gate electrode layers disposed between the first well pickup region and the first array; and
seventh dummy gate electrode layers disposed between the second well pickup region and the second array.

10. The semiconductor device of claim 1, further comprising a counter-doping region disposed between the first and second well pickup regions and between the third and fourth well pickup regions,
wherein the counter-doped region is disposed on the first well and doped with the second conductivity-type, a doping concentration of second conductivity-type dopants in the counter-doped region being greater than a doping concentration of first conductivity-type dopants in the first well.

11. A semiconductor device, comprising:
  first and second wells having a first conductivity-type spaced apart from each other in a first direction;
  a third well having a second conductivity-type different from the first conductivity-type, and including a first portion disposed on one side of the first and second wells, a second portion disposed on another side of the first and second wells, and a third portion connecting the first and second portions to each other and disposed between the first and second wells;
  a first array of bitcells disposed over the first well and the first and second portions of the third well;
  a second array of bitcells disposed over the second well and the first and second portions of the third well;
  a strap cell disposed over the first, second and third wells and between the first and second arrays, the strap cell comprising:
    first and second well pickup regions having the first conductivity-type, disposed over the first well and second well, respectively, and spaced-apart from each other in the first direction, a doping concentration of the first and second well pickup regions being greater than a doping concentration of the first and second wells; and
    a third well pickup region having the second conductivity-type, disposed over the third well and between the first and second well pickup regions, a doping concentration of the third well pickup region being greater than a doping concentration of the third well;
  first and second conductive patterns electrically connected to the first and second well pickup regions and extending over the first and second well pickup regions, respectively; and
  a third conductive pattern electrically connected to the third well pickup region and extending over the third pickup region.

12. The semiconductor device of claim 11, further comprising:
  a first power supply pattern extending in the first direction over the first array, the strap cell, and the second array, and electrically connected to the first and second conductive patterns; and
  second and third power supply patterns each extending in the first direction over the first array, the strap cell, and the second array, and electrically connected to the third conductive pattern.

13. The semiconductor device of claim 12, wherein the first power supply pattern is disposed between the second and third power supply patterns and is electrically connected to source regions of first and second transistors, having the second conductivity-type, of the bitcells of the first and second arrays,
  the second power supply pattern and is electrically connected to source regions of third transistors, having the first conductivity-type, of the bitcells of the first and second arrays,
  the third power supply pattern and is electrically connected to source regions of fourth transistors, having the first conductivity-type, of the bitcells of the first and second arrays, and
  the semiconductor device further comprises:
    a first bitline extending in the first direction over the first array, the strap cell, and the second array, and electrically connected to source regions of fifth transistors, having the second conductivity-type, of the bitcells of the first and second arrays; and
    a second bitline extending in the first direction over the first array, the strap cell, and the second array, and electrically connected to source regions of sixth transistors, having the second conductivity-type, of the bitcells of the first and second arrays.

14. The semiconductor device of claim 11, wherein a width, in the first direction, of the third well pickup region is greater than a width, in the first direction, of each of the first and second well pickup regions.

15. The semiconductor device of claim 11, further comprising:
  gate electrode layers extending in the second direction in the first and second arrays; and
  dummy gate electrode layers extending in the second direction in the strap cell,
  wherein the gate electrode layers and the dummy gate electrode layers are disposed on a same level and made of a same material.

16. A semiconductor device, comprising:
  first and second wells having a first conductivity-type spaced apart from each other in a first direction;
  a third well having a second conductivity-type different from the first conductivity-type, and including a first portion disposed on one side of the first and second wells, a second portion disposed on another side of the first and second wells, and a third portion connecting the first and second portions to each other and separating the first and second wells from each other;
  bitcells disposed over the first well and the first and second portions of the third well;
  a strap cell disposed over the first, second, and third wells, the strap cell comprising:
    first and second well pickup regions having the first conductivity-type, disposed over the first well and second well, respectively, and spaced-apart from each other in the first direction, a doping concentration of the first and second well pickup regions being greater than a doping concentration of the first and second wells; and
    a third well pickup region having the second conductivity-type and disposed over the third well and between the first and second well pickup regions, a doping concentration of the third well pickup region being greater than a doping concentration of the third well;
  first and second conductive patterns electrically connected to the first and second well pickup regions and extending over the first and second well pickup regions, respectively; and
  a third conductive pattern electrically connected to the third well pickup region and extending over the third pickup region,
  wherein the bitcells are disposed on only one side of the strap cell.

17. The semiconductor device of claim 16, further comprising:
  a first power supply pattern extending in the first direction over the bitcells and the strap cell, and electrically connected to the first and second conductive patterns; and
  second and third power supply patterns each extending in the first direction over the bitcells and the strap cell, and electrically connected to the third conductive pattern.

18. The semiconductor device of claim 17, wherein the first power supply pattern is disposed between the second and third power supply patterns and is electrically connected to source regions of first and second transistors, having the second conductivity-type, of the bitcells,
  the second power supply pattern and is electrically connected to source regions of third transistors, having the first conductivity-type, of the bitcells,
  the third power supply pattern and is electrically connected to source regions of fourth transistors, having the first conductivity-type, of the bitcells, and
  the semiconductor device further comprises:
    a first bitline extending in the first direction over the bitcells and the strap cell, and electrically connected to source regions of fifth transistors, having the second conductivity-type, of the bitcells; and
    a second bitline extending in the first direction over the bitcells and the strap cell, and electrically connected to source regions of sixth transistors, having the second conductivity-type, of the bitcells.

19. The semiconductor device of claim 16, wherein a width, in the first direction, of the third well pickup region is greater than a width, in the first direction, of each of the first and second well pickup regions.

20. The semiconductor device of claim 16, further comprising:
  gate electrode layers extending in the second direction in the first and second arrays; and
  dummy gate electrode layers extending in the second direction in the strap cell,
  wherein the gate electrode layers and the dummy gate electrode layers are disposed on a same level and made of a same material.

* * * * *